US010886605B2

(12) United States Patent
Varel et al.

(10) Patent No.: US 10,886,605 B2
(45) Date of Patent: Jan. 5, 2021

(54) SCATTERED VOID RESERVOIR

(71) Applicant: Kymeta Corporation, Redmond, WA (US)

(72) Inventors: Cagdas Varel, Seattle, WA (US); Steven Howard Linn, Hillsboro, OR (US); Felix Chen, Kirkland, WA (US)

(73) Assignee: KYMETA CORPORATION, Redmond, WA (US)

( * ) Notice: Subject to any disclaimer, the term of this patent is extended or adjusted under 35 U.S.C. 154(b) by 10 days.

(21) Appl. No.: 16/430,311

(22) Filed: Jun. 3, 2019

(65) Prior Publication Data

US 2019/0379111 A1    Dec. 12, 2019

Related U.S. Application Data

(60) Provisional application No. 62/681,538, filed on Jun. 6, 2018.

(51) Int. Cl.
| | |
|---|---|
| *H01Q 1/36* | (2006.01) |
| *H03L 7/099* | (2006.01) |
| *H01Q 15/00* | (2006.01) |

(52) U.S. Cl.
CPC ......... *H01Q 1/364* (2013.01); *H01Q 15/0086* (2013.01); *H03L 7/099* (2013.01)

(58) Field of Classification Search
CPC ...... H01Q 1/364; H01Q 3/44; H01Q 15/0086; H01Q 21/0012; H01Q 25/001;
(Continued)

(56) References Cited

U.S. PATENT DOCUMENTS 8,970,439 B2    3/2015    Maxwell
9,780,451 B2 *  10/2017   Stevenson ............ H01Q 9/0407
(Continued)

FOREIGN PATENT DOCUMENTS

JP           6139044       5/2017
WO        2011/042699     4/2011

OTHER PUBLICATIONS

International Search Report and Written Opinion for Application No. PCT/US2019/035672, dated Sep. 26, 2019, 11 pages.
(Continued)

*Primary Examiner* — Hoang V Nguyen
(74) *Attorney, Agent, or Firm* — Womble Bond Dickinson (US) LLP

(57) ABSTRACT

An antenna apparatus and method for using the same are disclosed. In one embodiment, the antenna comprises an antenna element array having a plurality of radiating radio-frequency (RF) antenna elements formed using portions of first and second substrates with a liquid crystal (LC) therebetween, the first substrate comprising a plurality of irises and the second substrate comprises a plurality of patches, wherein each of the patches is co-located over and separated from an iris in the plurality of irises with LC at least partially between each overlap region a patch and iris overlap; and a reservoir structure between the first and second substrates to hold LC and comprising areas around the RF antenna elements, the reservoir structure having a cavity large enough to accommodate thermal expansion of the LC and having one or more areas void of LC, wherein LC remains in patch/iris overlap regions of the plurality of radiating RF antenna elements even when additional LC could enter the one or more areas void of LC.

20 Claims, 17 Drawing Sheets

(58) Field of Classification Search
CPC ............... H01Q 3/2676; H01Q 9/0464; H01Q 21/0031; H01Q 21/005; H01Q 21/0087; H01Q 21/064
See application file for complete search history.

(56) References Cited

U.S. PATENT DOCUMENTS

| | | |
|---|---|---|
| 9,887,455 B2 | 2/2018 | Sazegar et al. |
| 9,887,456 B2 | 2/2018 | Bily et al. |
| 2010/0027100 A1 | 2/2010 | Lee et al. |
| 2012/0293374 A1 | 11/2012 | Kasai |
| 2015/0123748 A1 | 5/2015 | Stevenson et al. |
| 2015/0222021 A1 | 8/2015 | Stevenson et al. |
| 2015/0236412 A1 | 8/2015 | Bily et al. |
| 2015/0380824 A1 | 12/2015 | Tayfeh Alogodarz et al. |
| 2016/0261042 A1 | 9/2016 | Sazegar et al. |
| 2016/0261043 A1 | 9/2016 | Sazegar et al. |
| 2016/0372834 A1 | 12/2016 | Bily et al. |
| 2017/0069967 A1 | 3/2017 | Shrekenhamer |
| 2018/0358690 A1* | 12/2018 | Linn .................. H01Q 15/0086 |
| 2019/0036227 A1* | 1/2019 | Linn ..................... H01Q 21/00 |

OTHER PUBLICATIONS

International Search Report and Written Opinion Received for PCT Patent Application No. PCT/US2018/037135, dated Oct. 1, 2018, 10 pages.
International Search Report of Application No. PCT/US2018/043754 dated Nov. 7, 2018, 10 pages.
Taiwanese Search Report on the Patentability of Application No. 108119512, dated Sep. 29, 2020, 1 page.

* cited by examiner

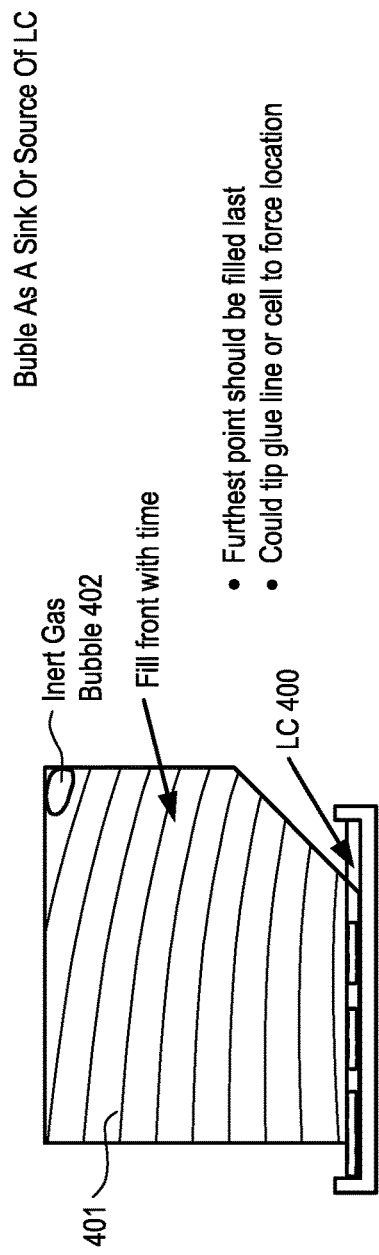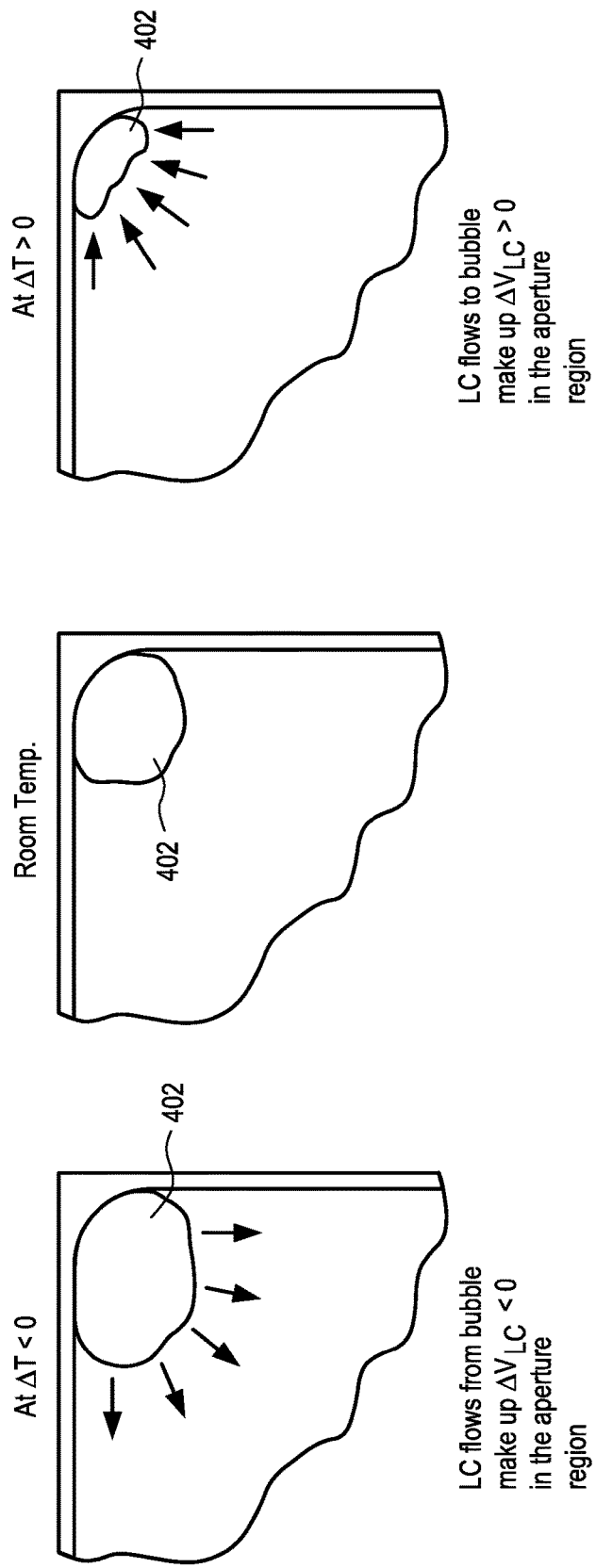

SCATTERED VOID RESERVOIR

PRIORITY

The present patent application claims priority to and incorporates by reference the corresponding provisional patent applications No. 62/681,538, titled, "SCATTERED VOID RESERVOIR," filed on Jun. 6, 2018.

FIELD OF THE INVENTION

Embodiments of the present invention relate to the field of radio frequency (RF) devices having liquid crystals (LCs); more particularly, embodiments of the present invention relate to radio frequency (RF) devices having liquid crystals (LCs) for use in a metamaterial-tuned antenna that includes an area to collect LC or provide LC to an area of the antenna in which antenna elements are located.

BACKGROUND OF THE INVENTION

Recently, surface scattering antennas and other such radio-frequency (RF) devices have been disclosed that use a liquid crystal (LC)-based metamaterial antenna element as part of the device. In the case of antennas, the LCs have been used as part of the antenna elements for tuning the antenna element. For example, LC is placed between two glass substrates that comprise an antenna array using liquid crystal display (LCD) manufacturing processes well-known in the art of LCDs. These glass substrates are spaced apart using gap spacers and are sealed at the edge using some type of sealant (e.g., adhesive).

Some RF antennas of the current state of the art suffer performance degradation over their operational temperature ranges, particularly as the temperature increases toward the upper end of the temperature operational range. This results from an RF frequency shift in the output of the RF elements as the temperature increases.

One of the causes of the RF frequency shift with temperature is due to volume expansion of the LC. As the LC occupies a cavity formed and defined by the glass substrates, deposited layers, the cell border seal, and internal spacers formed on the glass substrates, the construction of this cavity defines specific gaps between the electrodes of each RF antenna element that will be occupied by the tunable dielectric LC. The proper size of the gap between the electrodes, filled with the LC, is important in controlling the operational frequencies of the RF antenna element.

The volume of an empty LC cell over a temperature range is controlled by the coefficient of thermal expansion (CTE) of the glass substrates, gap spacers and the edge seal. The volume change of LC due to temperature change in an LC cell will be greater than the cavity volume change of the LC cell itself, because the CVE (coefficient of volume expansion) of the LC is much larger than the CTE of the LC cell components. In other words, because the magnitude of the CVE of the LC is large compared with the volume increase of the segment or aperture cavity, as the temperature increases, the increase in the LC volume is much greater than the increase of the cavity volume. Since thermal expansion forces are large, the LC volume increase forces the substrates apart, thereby resulting in increases in the size of the gaps at the RF aperture elements (gaps filled with LC) and shifts the resonant frequency of the RF antenna elements.

As temperatures decrease, the volume of LC will be less than the LC cell cavity volume, reducing the internal pressure of the LC cell. Atmospheric pressure will then push the glass down tighter on the cell spacers, reducing the cell gap if the modulus of elasticity of the spacers is such that the increasing pressure on the spacers can compress the spacers. If the difference in volume is great enough, this can result in places where the LC volume has been replaced by residual gas that was dissolved in the LC. The immediate result of this condition may be voids in places in the aperture where the dielectric of the LC has been replaced with residual gas affecting antenna element performance. Once the cell warms up sufficiently, it may take time for these voids to disappear (if there is sufficient gas in the voids, the gas may need to re-dissolve for the void to disappear). Additionally, in the locations where the voids formed, alignment defects may be present.

A similar problem to the low temperature case can result from being at lower atmospheric pressures, such as those that arise at higher altitudes. In this case, the pressure exerted on the substrates (holding the substrates on their spacers) is reduced. Non-uniformity and voids can result.

Thus, the change in LC cell gap size and the increase in LC cell gap non-uniformity with ambient temperature and pressure changes are problematic for forming RF antenna elements that function correctly.

SUMMARY OF THE INVENTION

An antenna apparatus and method for using the same are disclosed. In one embodiment, the antenna comprises an antenna element array having a plurality of radiating radio-frequency (RF) antenna elements formed using portions of first and second substrates with a liquid crystal (LC) therebetween, the first substrate comprising a plurality of irises and the second substrate comprises a plurality of patches, wherein each of the patches is co-located over and separated from an iris in the plurality of irises with LC at least partially between each overlap region a patch and iris overlap; and a reservoir structure between the first and second substrates to hold LC and comprising areas around the RF antenna elements, the reservoir structure having a cavity large enough to accommodate thermal expansion of the LC and having one or more areas void of LC, wherein LC remains in patch/iris overlap regions of the plurality of radiating RF antenna elements even when additional LC could enter the one or more areas void of LC.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 4A illustrates an antenna array segment being supplied LC from the bottom so that an inert gas bubble ends up located in the upper corner of segment.

FIG. 4B-4D illustrate a side view of a portion of one embodiment of an antenna aperture segment with a bubble in different stages.

DETAILED DESCRIPTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Overview

A radio-frequency (RF) antenna that includes a switchable dielectric medium (e.g., liquid crystal (LC)) is disclosed. In one embodiment, the RF antenna includes a plurality of RF radiating antenna elements (e.g., metamaterial scattering antenna elements such as, for example, described below) that include the switchable dielectric medium (e.g., LC). Using the techniques disclosed herein, an RF frequency shift of the RF antenna elements due to varying temperatures is significantly reduced over RF antenna structures of the prior art. Additionally, in one embodiment, after the switchable dielectric medium (e.g., LC) has been introduced into each of the RF antenna elements, the switchable dielectric medium remains stable in the critical operational parts of the RF antenna elements. That is, even if areas devoid of the switchable dielectric medium (e.g., voids or bubbles) are introduced, are formed around or near, or move into areas near the critical operational parts of the RF antenna elements as a result of construction methods or mechanical, thermal or other stresses applied to the RF antenna device, the RF antenna element operation remains stable.

In one embodiment, the antenna includes an LC reservoir to collect LC from and supply LC to an area where radiating radio-frequency (RF) antenna elements are located in the antenna. In one embodiment, this area is in the RF active area. In one embodiment, the LC is between a pair of substrates (e.g., glass patch and iris substrates) comprising the RF antenna elements and the LC reservoir collects LC from that area when the LC expands. In one embodiment, the LC expands into the LC reservoir (i.e., undergoes LC expansion) due to at least one environmental change (e.g., a temperature change, a pressure change, etc.). The use of the LC reservoir helps reduce, and potentially minimize, void formation and LC gap variation due to temperature range and pressure range effects in antenna apertures. However, even if voids form due to the use of the LC reservoir when LC expansion occurs, the RF antenna elements remain operational.

Figure 1B:
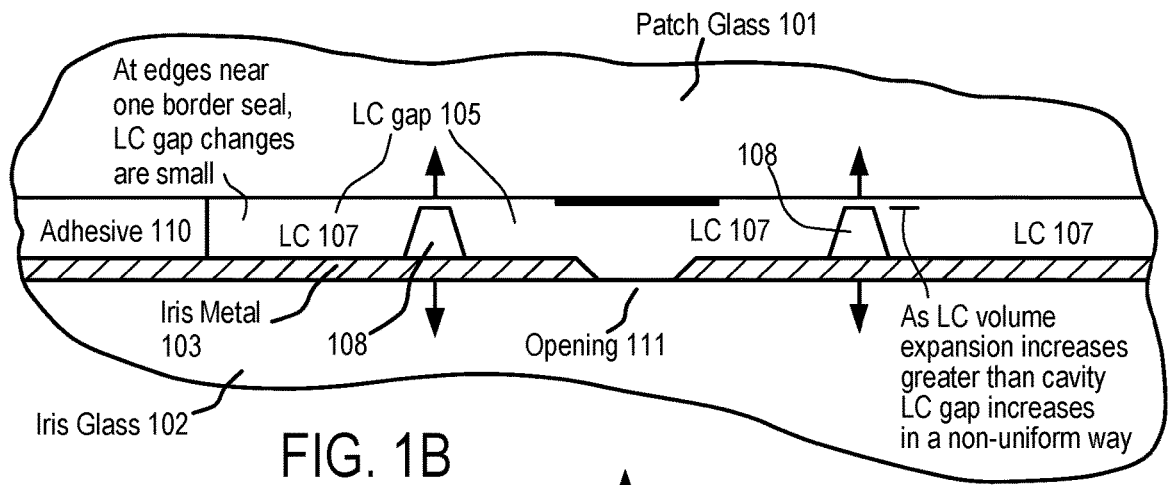
FIGS. 1A-C illustrates a portion of an antenna aperture in different states based on temperature.
Figure 1A:
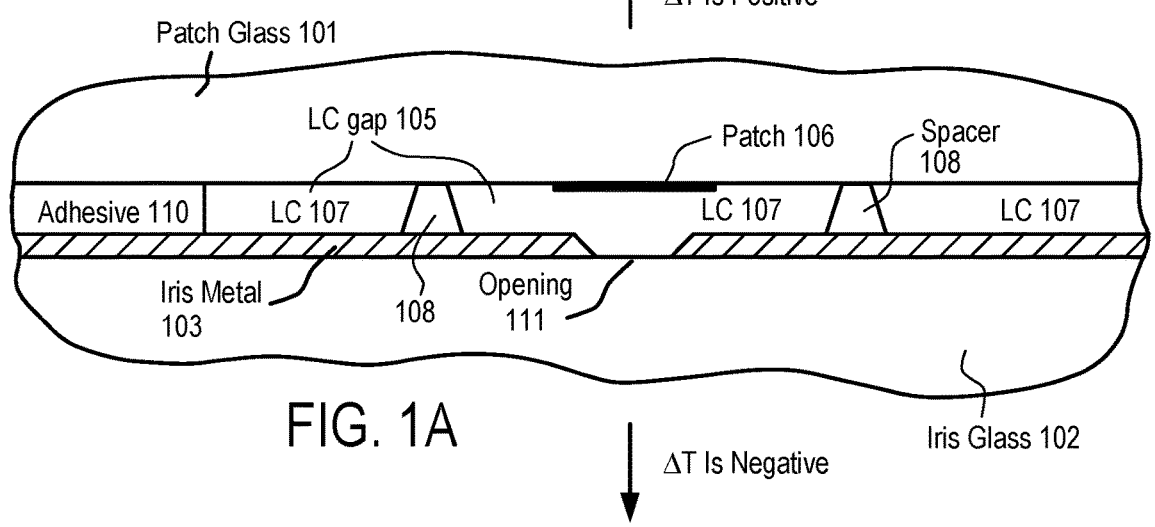
Figure 1C:
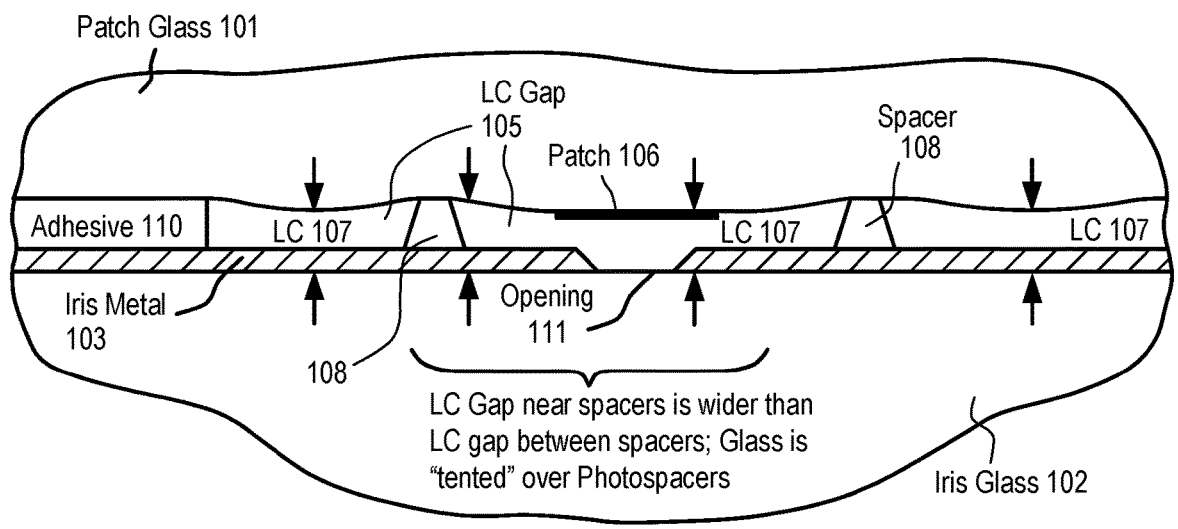

FIGS. 1A-1C illustrate a partial side view of an antenna aperture. The antenna aperture includes two substrates with patch and iris pairs that are separated by a gap with LC within the gap. The substrates are spaced by gap spacers.

Referring to FIG. 1A, a patch glass substrate 101 is over an iris glass substrate 102. Iris metal (layer) 103 is on iris glass substrate 102, and an iris/slot 111 is located in the area above glass substrate 102 that does not include iris metal 103. Spacers 108 (e.g., photospacers) are located on top of iris metal 103 between patch glass substrate 101 and iris glass substrates 102.

Adhesive 110 attaches iris metal 103 on iris glass substrate 102 to patch glass 101 that is on patch glass substrate 101 and acts as a border seal to contain the LC. Note that adhesive may be used through the antenna element array to attach a patch glass substrate 101 and iris glass substrate 102 at multiple locations while sealing the edges of the antenna aperture.

One LC gap 105 is between adhesive 110 and one of the spacers 108 and between spacers 108, with LC 107 in LC gap 105, and represents the distance separating patch glass substrate 101 and iris glass substrate 102.

FIG. 1B illustrates a partial view of the antenna aperture of FIG. 1A when the change in temperature is positive. The increase in temperature causes the LC between the substrates to expand. At the edges near the border seal (e.g., adhesive 110), the vertical change in the distance in the LC gap 105 between the substrates is small. Also, LC gap 105 near spacers 108 widens, thereby causing at least one of substrates 101 and 102 not to be in contact with spacers 108. In one embodiment, the substrate not in contact with spacers 108 is patch glass substrate 101 while iris substrate 102 remains in contact with spacers 108. LC gap 105 at the patch/iris overlap is also wider, thereby causing a shift in the resonant frequency of the RF element. However, as the LC volume expansion increase becomes greater, LC gap 105 increases in a non-uniform way.

In the cold temperature case, the cavity in the aperture part of the cell will decrease much more slowly than the LC volume. FIG. 1C illustrates the partial antenna aperture of FIG. 1A when the change in temperature is negative. In this case, the LC gap 105 near spacers 108 is wider than the LC gap between spacers 108, thereby causing the substrate (e.g., glass substrate 101) to become tented over spacers 108. This may also result in a resonant frequency shift at the RF element.

To avoid the problems associated with both positive and negative changes in temperature and/or pressure, in one embodiment, an LC reservoir is included in the aperture. In one embodiment, the nature of the reservoir would be that, when the LC volume is larger than the cavity volume, the reservoir takes up the excess LC volume from the "quality area" of the LC cell cavity. In one embodiment, the quality area is the area of the aperture defined as the RF active region (or area) in FIGS. 3A and 3B. That is, in a segment of the antenna array, there are areas in which RF antenna elements are located and other areas, referred to as RF inactive areas, where there are no RF antenna elements, and an area in which no RF antenna elements are located is used for the LC reservoir. In the opposite case, when the LC volume is smaller than the cavity volume, the reservoir supplies LC to the quality area of the LC cell cavity. This requires that, in each condition, the reservoir (positioned outside of the quality area) takes up the excess LC when hot, and supplies the extra LC when cold.

In one embodiment, for the reservoir to be effective, the LC gap in the aperture quality area of the cavity is controlled. In the case of higher temperatures, the volume expansion of the LC will tend to push the substrates apart, increasing the gap in an uncontrolled and non-uniform manner.

To control the gap with spacers, the two substrates are held together on their spacers. This is done internally within the cavity or externally outside the cavity. More specifically, in one embodiment, the LC cell is formed with a pressure difference between the outside of the cell and the inside of the cell. This results from forming the cell gap under pressure, compressing the spacers and the gaps between the spacers, making a seal, and then releasing the external pressure, which in turn results in a slightly smaller volume of LC in the cavity than the cavity would hold if no external pressure had been applied. The resulting pressure difference between the outside of the cell and the inside of the cell holds the substrates on the spacers. Alternatively, one can form the cell gap while gluing the substrates together. With the space available between the RF elements, this could be done with dots of adhesive between the elements, unlike with an LCD where there would be no space available for a structure like this. The advantage in this case would be, with the adhesive holding the substrates together, there would be less chance of the gap changing during LC expansion from the LC not flowing into the reservoir faster than the substrates are pushed apart. Spacers in the aperture are used to control the gap when the substrates are held together with adhesive. In one embodiment, adhesive is applied to one or both of the substrates before the assembly process. During assembly, the two substrates are held in contact with the internal spacers while the adhesive cures holding the substrates together. This would make sure that, when volume expansion of the LC exceeds the cavity volume expansion, the two substrates remain held together in the aperture quality area. No adhesive would be needed to hold the substrates together outside of the quality area. The LC in excess of that required to fill the gap in the aperture region flows into the LC reservoir outside of the quality area, instead of pushing the substrates apart.

Thus, in the case of the positive temperature change, the reservoir provides a place for the excess LC (due to LC expansion) to go, and in the case of the negative temperature change, the reservoir supplies LC to the aperture part of the cavity, which helps prevent voids from forming.

In one embodiment, the reservoir is designed in such a way that the volume of the reservoir can easily expand and contract in size in reaction to small changes in pressure within the cell. In the high temperature case, as the volume of the LC exceeds the total volume of the cavity (since the LC gap in the aperture region is increasing slowly relative to the LC volume), the reservoir takes up the excess without dramatically increasing the pressure inside the cell. In the other case, as the temperature decreases, the reservoir supplies LC to the aperture in such a way that the pressure in the cell doesn't dramatically decrease. (The LC being a fluid, the pressure changes resulting from compression or expansion in a relatively fixed cavity can be large).

There are several approaches that might accomplish this objective. These include building a reservoir structure in the area outside the quality area and including a bubble in the reservoir structure.

Build a Reservoir Structure in the Area Outside of the Aperture Quality Area

In one embodiment, the reservoir structure has one or more of the following features that can be used to build a reservoir. Note that the required volume of the reservoir and the area that is available for the reservoir to be placed in also are considerations in its design, but may be determined by those skilled in the art based on the design of the remainder of the antenna array.

In one embodiment, one or more of the glass substrates (e.g., iris, patch, or both) outside of the aperture quality area has a decreased thickness. In other words, selectively thinning the glass(es) (substrate(s)) in the reservoir region is performed. In one embodiment, the glass is thinned in half. For example, where the glass substrate is 700 microns thick, the thickness of the glass substrate outside of the aperture quality area is reduced to 350 microns. This results in glass substrates that can flex inward or outward more easily in response to internal pressure changes due to expansion/contraction. Note that it is not required that one or more of the substrates be thinned in half; other amounts of thinning may be used.

In one embodiment, the location, size, Young's modulus (modulus of elasticity), and the spring constant of the spacers impact the operation of the LC reservoir. The spacers may be a photospacer (e.g., a polymer spacer). For example, the spacers in the reservoir region are changed to have a lower spring constant than in the quality area of the antenna element (relative to the spacers in the aperture quality area) so that the antenna element cavity in these regions can change volume more easily in response to pressure changes. In one embodiment, the spring constant in the antenna element area is about $10^8$ N/m while the spring constant in the area outside the quality area is about $10^5$ to $10^6$ N/m. Note that these are just examples and the spring constant can depend on multiple factors, including, but not limited to, reservoir geometry, substrate material constants, spacer material constants, etc.

In another embodiment, the spacer density is reduced in the reservoir region. While any decrease in density improves performance, in one embodiment, the density is reduced by 75% in the reservoir region. Note that in other embodiments these numbers vary due to their dependence on the material used for the spacer, size of the spacer, etc.

In yet another embodiment, the spacers are shortened in the reservoir region. This amount of shortening is based on its impact on volume. The more volume created by shortening the spacers, the better. This consideration is counterbalanced by the need to prevent the two substrates (and the structures built on them) from touching. In one embodiment, the spacer height is reduced by 80%. Note that other amounts of reduction could also be used. For example, in one embodiment, reservoir spacers are formed in a region that doesn't contain the iris metal layer. More specifically, in one embodiment, the iris metal layer is 2 um thick. In this case, outside of the RF active area, the need for this metal is controlled by waveguide considerations (e.g., there cannot be holes through which the RF leaks), while the cell gap is roughly 2.7 um. If iris metal is removed from the reservoir regions in these areas, then the available volume in these areas increases by possibly 2 um in thickness.

In still another embodiment, the intermediate reverse pressure level is used to seal off the LC cell in the reservoir region, which is part of a seal off process. In the seal off process, there is LC in the cell and an opening in the border seal. In one embodiment, the LC is placed by vacuum filling. However, this is not a requirement and it may be placed using other well-known techniques. The cell is pressurized to remove LC from the cell. Thus, the amount of LC in the LC reservoir is controlled by the pressurization process. Thus, the reverse pressurization seal off process uses a mechanism to apply pressure to selected areas of the segment.

In one embodiment, the antenna segment containing RF antenna elements is filled and sealed off in such a way that the reservoir, after filling, is in an intermediate volume state in which it is not completely full and not completely empty. At the intermediate volume, the reservoir is capable of receiving and supplying LC. Antenna segments are combined to form the entire antenna array. For more information on antenna segments, see U.S. Pat. No. 9,887,455, entitled "Aperture Segmentation of a Cylindrical Feed Antenna".

Figure 2A:
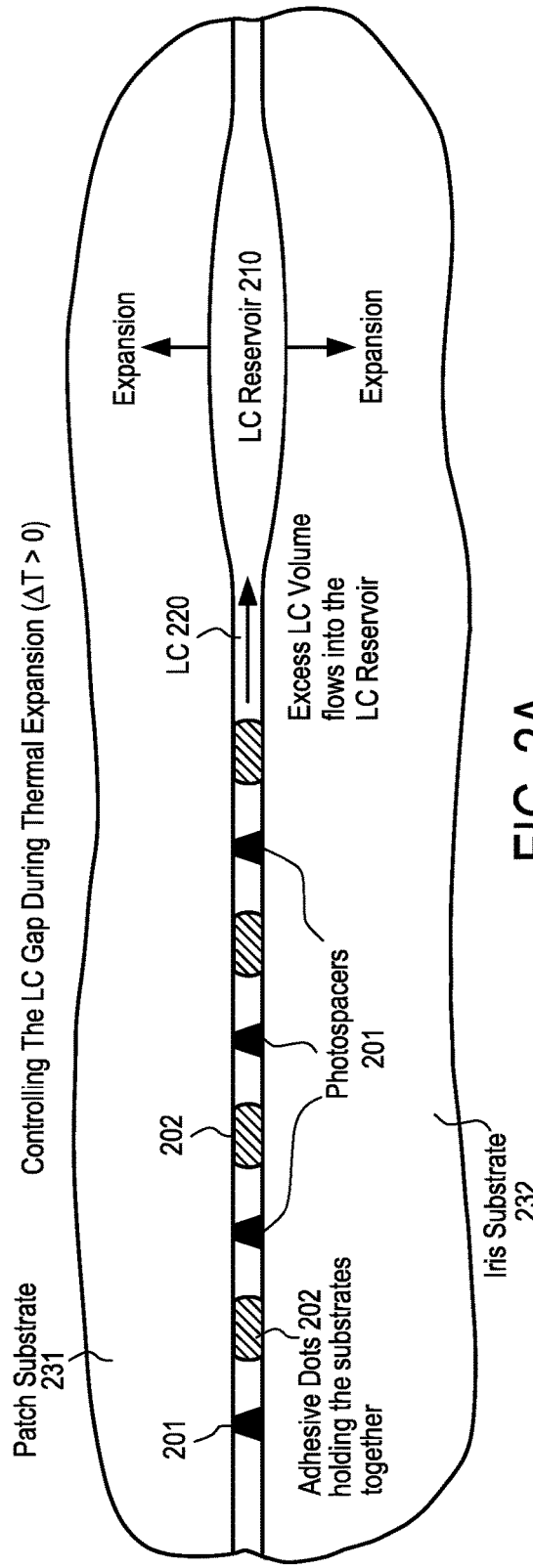
FIG. 2A illustrates controlling the gap between substrates that form the antenna elements during thermal expansion.

FIG. 2A illustrates controlling the gap between substrates that form the antenna elements during thermal expansion. Referring to FIG. 2A, adhesive dots 202 located between photospacers 201 to hold patch glass substrate 231 and iris substrate 232 together. This enables the excess LC 220 to flow into LC reservoir 210, which undergoes expansion at that area between the substrates when the temperature change is greater than zero. In one embodiment, the adhesive dots 202 comprise a viscous liquid ultraviolet (UV) adhesive. In one embodiment, the gap between the substrates where LC reservoir 210 is located is due to a lack of adhesive between the substrates in the area and a thinning of the substrates at that location.

Figure 2B:
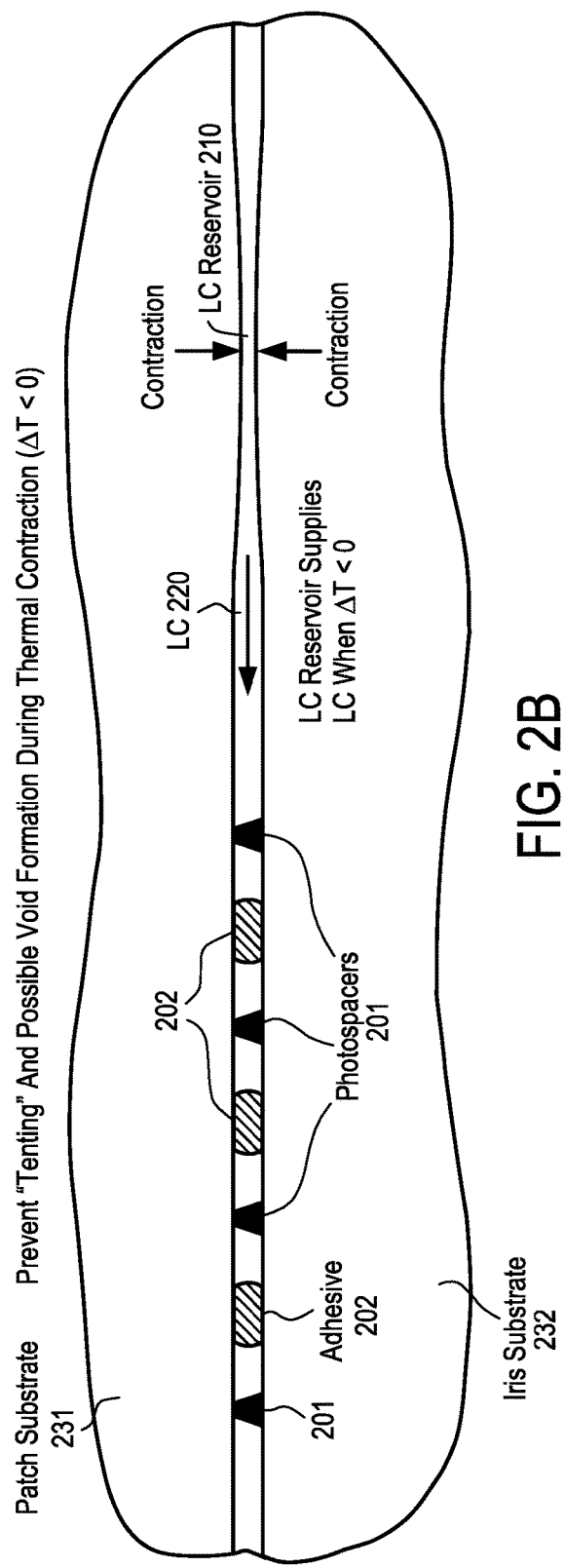
FIG. 2B illustrates substrates that form the antenna elements configured to control the gap during thermal contraction.

FIG. 2B illustrates the adhesive dots 202 formed between photospacers 201 holding the substrates that form the antenna elements together to control the gap during thermal contraction. In this case, LC reservoir 210 provides LC 220 when the temperature change is less than zero. In one embodiment, the gap between the substrates where LC reservoir 210 is located is due to a lack of photospacers between the substrates in the area of LC reservoir and a thinning of the substrates at that location. This could also be achieved by having shorter photospacers in the area of LC reservoir 210 so that the movement of the substrates towards each other in the area of LC reservoir 210 is limited to the height of the shorter photospacers. By using the adhesive dots 202 formed between photospacers 201, tenting and possible void formation are prevented during thermal contraction when the change in temperature is less than zero.

Thus, the area of the substrates that contains LC reservoir 210 acts as a spring-like diaphragm that opens and closes, thereby causing the LC to enter and exit LC reservoir 210. In this way, the two substrates are not pushed apart during thermal expansion.

Figure 3A:
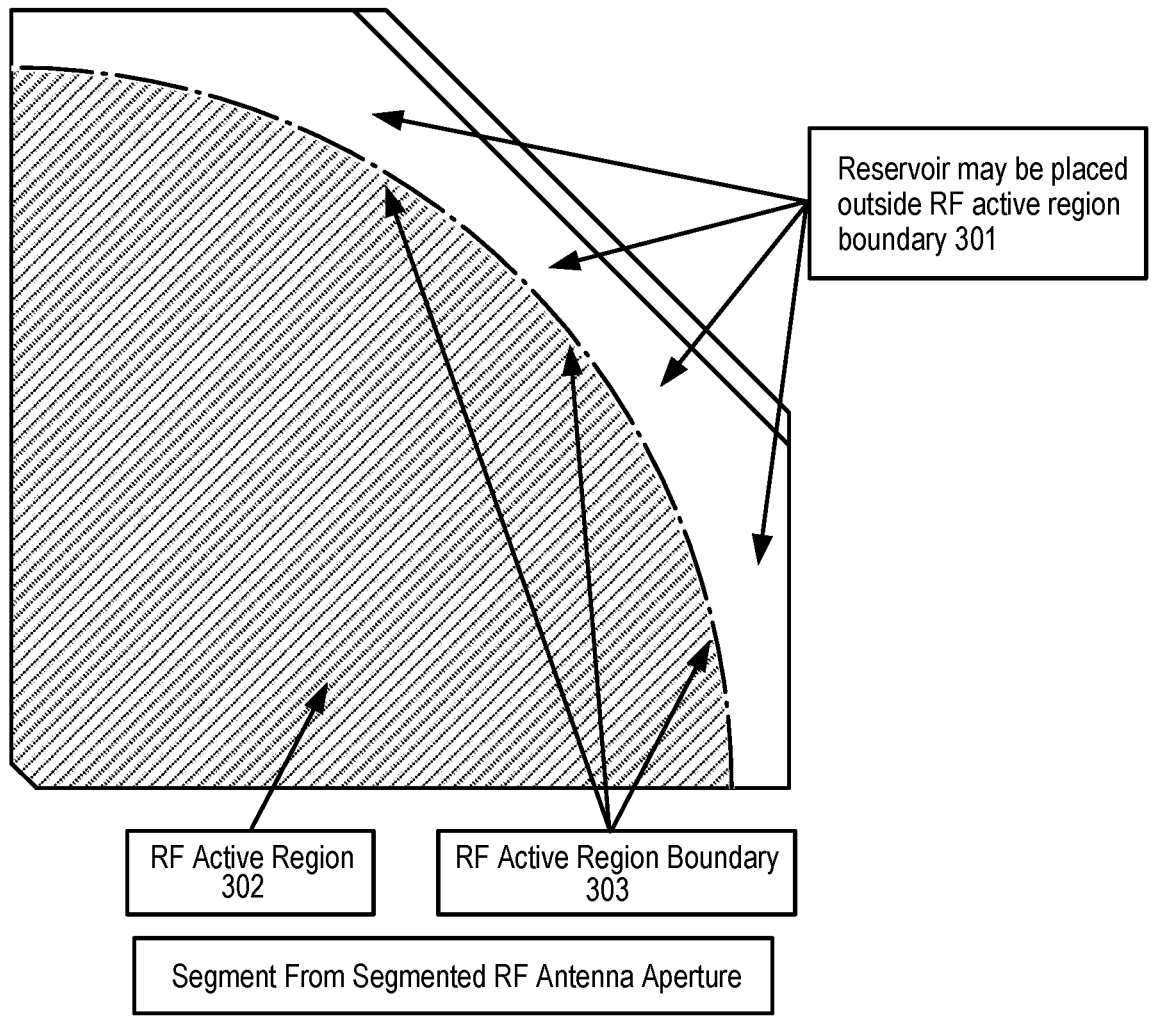
FIGS. 3A and 3B illustrates potential reservoir placements in one embodiment of an antenna array segment.

FIG. 3A illustrates potential reservoir placements in one embodiment of an antenna array segment. Referring to FIG. 3A, the segment from a segmented RF antenna aperture includes an RF active region 302 that is bounded by an RF active region boundary 303. The RF quality area 302 is where the antenna elements (e.g., surface scattering metamaterial antenna elements as described in more detail below) are located. In one embodiment, the area 301 of the segment outside RF active region 302 is where a reservoir is placed. In one embodiment, borders are included to constrain the size of the RF reservoir in a segment and/or constrain where the LC flows. In one embodiment, the LC reservoir is in constant hydraulic contact with the LC in the quality area.

Note that there may be more than one LC reservoir in the segment of the aperture so that the LC can expand into or flow from multiple locations in the segment based on the change in temperature and/or pressure.

Selective Bubble Technique

In one embodiment, one or more gas bubbles are included in the LC reservoir. Each gas bubble represents a void area in that it is an area within the LC cell where there is compressibility (as opposed to being incompressible like LC, glass, metal, etc.). In other words, the LC reservoir includes a compressible medium. The compressibility is due in part to the absence of LC and presence of gas bubble in that area. In one embodiment, the gas is at a pressure that is lower than atmospheric pressure. Note that the higher the pressure in the void, the more volume is required to make a reservoir of sufficient size.

As discussed above, the LC reservoir is in constant hydraulic contact with the LC in the quality area. That is, there is a continuous or constant hydraulic, or fluidic, contact between the reservoir space and the LC that is in the active region of the antenna.

In one embodiment, the gas bubble is an inert gas that does not interact with the LC. For example, nitrogen or argon may be used. The volume of a bubble of inert gas can expand and contract in volume in response to much smaller pressure changes. By controlling the location of the formation of the bubble, and ensuring that the bubble remains in the desired location, the movement of LC into and out of the LC reservoir occupied by the bubble is controlled over a temperature range, thereby making part of the volume of the bubble act as a reservoir for the LC.

In one embodiment, the composition and location of a bubble is controlled when forming the bubble during the filling process. If one introduced an inert gas during the filling process, after degassing but before filling, the background gas (the inert gas) inside the cell will be trapped once the LC seals off the fill opening. In one embodiment, the volume of the cell, the solubility of the inert gas in the LC, and the partial pressure of the inert gas in the fill chamber before filling will control the size of the bubble remaining after filling is complete. If the bubble is formed as a vacuum, in one embodiment, the composition of the residual gas is not as important. Further, if the antenna segments that have the RF antenna elements and together form the array are oriented vertically, and the glue line is shaped properly, the final location of the bubble will be in the highest point.

In one embodiment, the bubble is placed and stays in a particular location. In one embodiment, this is accomplished by forcing the bubble to form in a place where a bubble at this location (versus all other locations) is the lowest possible energy state of the system for all conditions. In one embodiment, this state is created by taking several steps. One could make the bubble location a place where the surface area of the bubble is substantially reduced, or even minimized. Another way to lower the state energy would be to lower the surface energy of the substrate surfaces in this location, so that the LC does not want to wet the substrates in this area. Thus, for the gas bubble to move or reform elsewhere, the energy barrier and budget of moving the bubble out of its location by forcing LC into this low surface energy area, and of reforming the bubble in an area already occupied by LC, must be overcome. Finally, if the bubble were locally at the highest point gravitationally, within normal positioning of the antenna, one could also create a barrier to movement of the bubble(s).

FIG. 4A illustrates an antenna array segment 401 being supplied LC from the bottom so that inert gas bubble 402 ends up located in the upper corner of segment 401. Alternatively, antenna array segment 401 could be filled in such a way that the furthest point (where bubble 402 is to reside) is filled last. Note that segment 401 could be tipped if being filled while in a more horizontal position to force bubble 402 to reside at a particular location. For more information on segments, see U.S. Pat. No. 9,887,455, entitled "Aperture Segmentation of a Cylindrical Feed Antenna".

FIGS. 4B-D illustrate the bubble in three different states based on temperature. Referring to FIG. 4C, bubble 402 is a certain size when at room temperature. As shown in FIG. 4B, the LC flows away from bubble 402 so that the change in LC volume is less than zero in the LC reservoir when the change in temperature is less than zero. As shown in FIG. 4D, the LC flows toward bubble 402 so that the change in LC volume is greater than zero in the LC reservoir when the change in temperature is greater than zero.

In one embodiment, small bubbles are formed in the cavity formed by the iris metal. In this case, voids are stabilized in the irises. For reservoirs outside the RF active area, numerous small features in the iris layer outside of the RF choke feature with stabilized voids are another way to form the reservoir.

An Example of an LC Reservoir Implementation

In one embodiment, the potential temperature of the interior of the antenna aperture is expected to range from 20° C. to 70° C. In this case, the LC in one antenna aperture segment (of the multiple segments that together form the antenna aperture) is anticipated to expand in volume when the temperature is in the range of 20° C. to 70° C., with an estimated total LC volume to be equal to $4.00E+11$ um$^3$. Thus, the LC reservoir needs to accommodate a change in temperature of 50° C., which produces a change in volume over a change in temperature of 50° C. equal to $1.31 E+10$ um$^3$. Also, in one embodiment, the LC in the antenna aperture segment has a coefficient of volumetric expansion (CVE), which is a measure of percent volume change per temperature, or $(\Delta V/V)/\Delta T$) equal to 0.000657 in$^3$/in$^3$/° C.

With this in mind, in one embodiment, if the antenna aperture is constructed using RF aperture segments, the LC reservoir is constructed to compensate RF aperture segments for a thermal volume expansion of $1.31 E+11$ um$^3$ while having the following features:

a. limiting the thermal expansion of the gap between the patch and iris metals in the area of the RF element array (e.g., array of surface scattering metamaterial antenna elements such as, for example, but not limited to, those described in greater detail below;

b. maintaining the cell gap uniformity over temperature; and c. keeping the substrates in contact with the spacers during the thermal expansion process that results from an increase in temperature within the antenna aperture.

Note that in one embodiment, the antenna aperture uses heaters in the RF aperture segments. Because of the use of heaters in RF apertures, the design of the LC reservoir is more focused on elevated temperature compensation and less so on cold temperature compensation. For more information on antenna segmentation and aperture segments that are combined into an aperture array (e.g., four aperture segments forming one antenna array) that may be with LC reservoir embodiments described herein, see U.S. Pat. No. 9,887,455, entitled "Aperture Segmentation of a Cylindrical Feed Antenna".

In view of the LC reservoir construction contemplated above, in one embodiment, the antenna aperture is implemented with the patch and iris substrates attached together in the RF antenna element array region of the antenna aperture segment. In one embodiment, these substrates are attached together using an adhesive or other well-known mechanism to adhere the substrates together. This embodiment of the antenna aperture also includes a feature in the segment that can act as a sink or source for LC in the segment to aid with volume compensation for one drop filling, and thermal expansion or contraction of LC for operation of segments at temperatures other than room temperature. That is, in one drop filling, there is no opening in the border seal near the outer border of the antenna aperture. One substrate (e.g., iris glass substrate, patch glass substrate) has the border seal adhesive placed on it, is placed on the bottom, the top substrate is placed above the bottom substrate, aligned, vacuum is drawn, the two substrates are placed on top of each other, pressed together, and are held in placed while the border seal adhesive is cured. Therefore, the pressure on the spacers depends in part on the amount of LC between the substrates. Further, the final LC gap of an antenna aperture segment depends on a derivation of the proper amount of LC placed inside between the substrates. Any error in the actual volume of the final cavity volume of the cell (versus the volume of the LC put inside the segment cavity) changes the LC gap. If a reservoir is inside the segment, the role of the LC is diminished or eliminated, so that the spacers control the LC gap. This means that the LC gap is now an insensitive function of the size of any error in the segment cavity volume.

Also, the embodiment of the antenna aperture includes a structure to enable the LC to be able to move into and out of the reservoir repeatedly.

Figure 5:
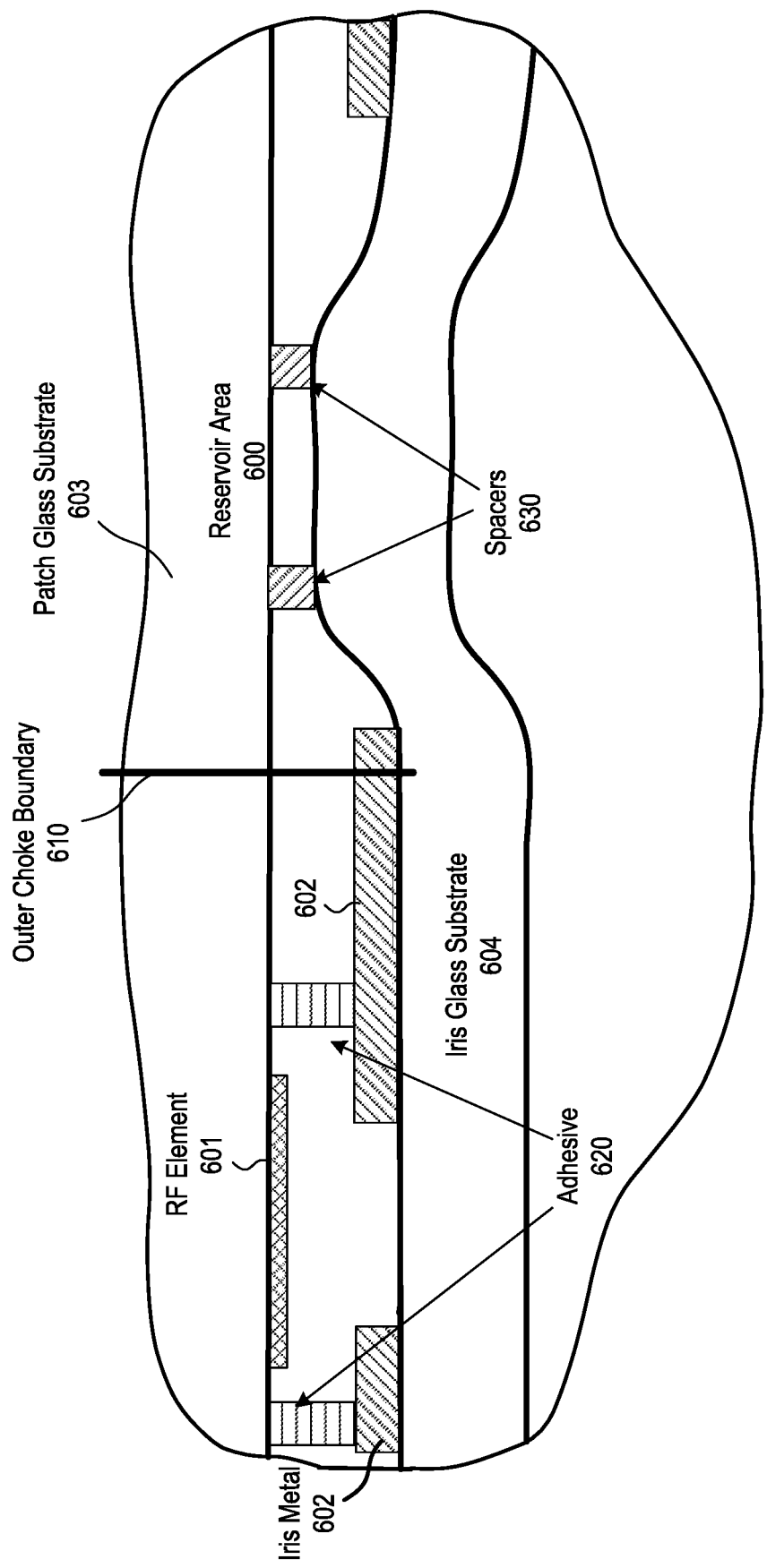
FIG. 5 illustrates one embodiment of an LC reservoir structure.

FIG. 5 illustrates one embodiment of an LC reservoir structure. Referring to FIG. 5, an LC reservoir area 600 is located at the periphery of the antenna element array outside of the outer choke ring boundary 610. Outer choke ring boundary is the area outside of the antenna element array that includes an RF choke that is used to greatly reduce and/or eliminate RF radiation from leaking out of the antenna aperture. An example of an antenna aperture with an RF choke is described in U.S. Patent Application No. 20170256865, entitled "Broadband RF Radial Waveguide Feed with Integrated Glass Transition, filed Feb. 24, 2017.

In one embodiment, iris glass substrate 604 is thin (e.g., 350 um) and is deformable at low pressures (e.g., 14.7 psi) when supports of patch glass substrate 603 and iris glass substrate 604 are widely spaced (e.g., 0.5 to 1 mm.

In one embodiment, there is potentially no patch metal in this region. As shown in FIG. 5, reservoir area 600 does not contain patch metal such as the patch metal of RF antenna element 601.

Some spacers are desirable to keep the substrates apart. In one embodiment, spacers 630 keep patch glass substrate 603 and iris glass substrate 604 apart. This density is dependent on the supplier's material choices, size, etc. The spacers are formed on the substrate during fabrication. These might be formed by a deposition and patterning a layer of material. In one embodiment, the spacers are compatible with the layer beneath such that they would adhere to the layer beneath them. They could be metal, inorganic dielectric, photo-patternable organic, etc. materials.

With a spacer height of 0.5 um and deformation of patch glass substrate 603 and iris glass substrate 604, the segment is sealed at pressures (e.g., 0.25 atm to 4.0 atm or higher, etc.) where iris glass substrate 604 is deformed to a gap height of 0.5 um in regions of the antenna element array. After seal of, the pressure will be at atmospheric pressure. In one embodiment, these regions are placed to avoid crosstalk between the iris metal and signals on the patch.

Using the configuration of FIG. 5, reservoir 600 has a gap difference from "full" to "empty" of 2.7 um.

As discussed above, in one embodiment, the area required to sink an LC volume of 1.31 E+10 (um$^3$) is approximately 50 cm$^2$ or more.

| LC Volume (um^3) | Gap change (um) | Area Required (um^2) | cm^2 |
|---|---|---|---|
| 1.31E+10 | 2.7 | 4.87E+09 | 4.87E+01 |

This assumes that the edges of reservoir(s) do not create significant area overhead, there is no "bowing out" of the glass substrates (patch or iris glass substrates) in the LC reservoir area, and the deformation of the glass substrates has minimal effect on gap in nearby structures.

In one embodiment, the size of the LC reservoir can be reduced if the iris metal (e.g., copper) is not included in (e.g., removed from) the reservoir area. In this embodiment, the edges of reservoir(s) do not create significant area overhead, there is no "bowing out" of the glass substrates (patch or iris glass substrates) in the LC reservoir area, and the deformation of the glass substrates has minimal effect on gap in nearby structures. Also, in this embodiment, with a minimal spacer height of 1.0 um and deformation of the iris and patch glass substrates, the antenna aperture segment is sealed at pressures where the glass substrate is deformed to a gap height of 1.0 um in regions shown in FIG. 3A. With the above features of the antenna and without allowing the glass substrate to "bow out" of normal position (e.g., 20 um bow out), an LC reservoir is included in the antenna aperture with gap difference from "full" to "empty" of 5.2 um.

One benefit of this embodiment is that by not having iris metal in reservoir areas, potential cross talk with other patch glass wiring is avoided.

Area required to sink an LC volume of 1.31 E+10 (um^3) in a reservoir including iris layer removal is approximately an area of about 25 cm$^2$ or more to accommodate such structure.

| LC Volume (um^3) | Gap change (um) | Area Required (um^2) | cm^2 |
|---|---|---|---|
| 1.31E+10 | 5.2 | 2.53E+09 | 2.53E+01 |

In an alternative embodiment, the LC reservoir is created by glass substrate deformation. In one such embodiment, iris and patch glass substrates deflect either or both enough to create a dimple, where the depth and width of the dimple creates required reservoir area.

In one embodiment, to achieve required reservoir area, deflection parameters are calculated. More specifically, using the equation for deflection of a circular plate, under a distributed load in conjunction with the stress-strain curve for patch glass, the load to provide enough deflection is calculated such that the desired dimple depth remains after load release. Also, the fluid statics that the load from liquid crystal flow at a given temperature are confirmed to show there is enough to deflect the dimple enough elastically to maintain constant cell gap. Thus, by using these calculations, the impression force to achieve the needed depth profile of the reservoir is determined.

Figure 3B:
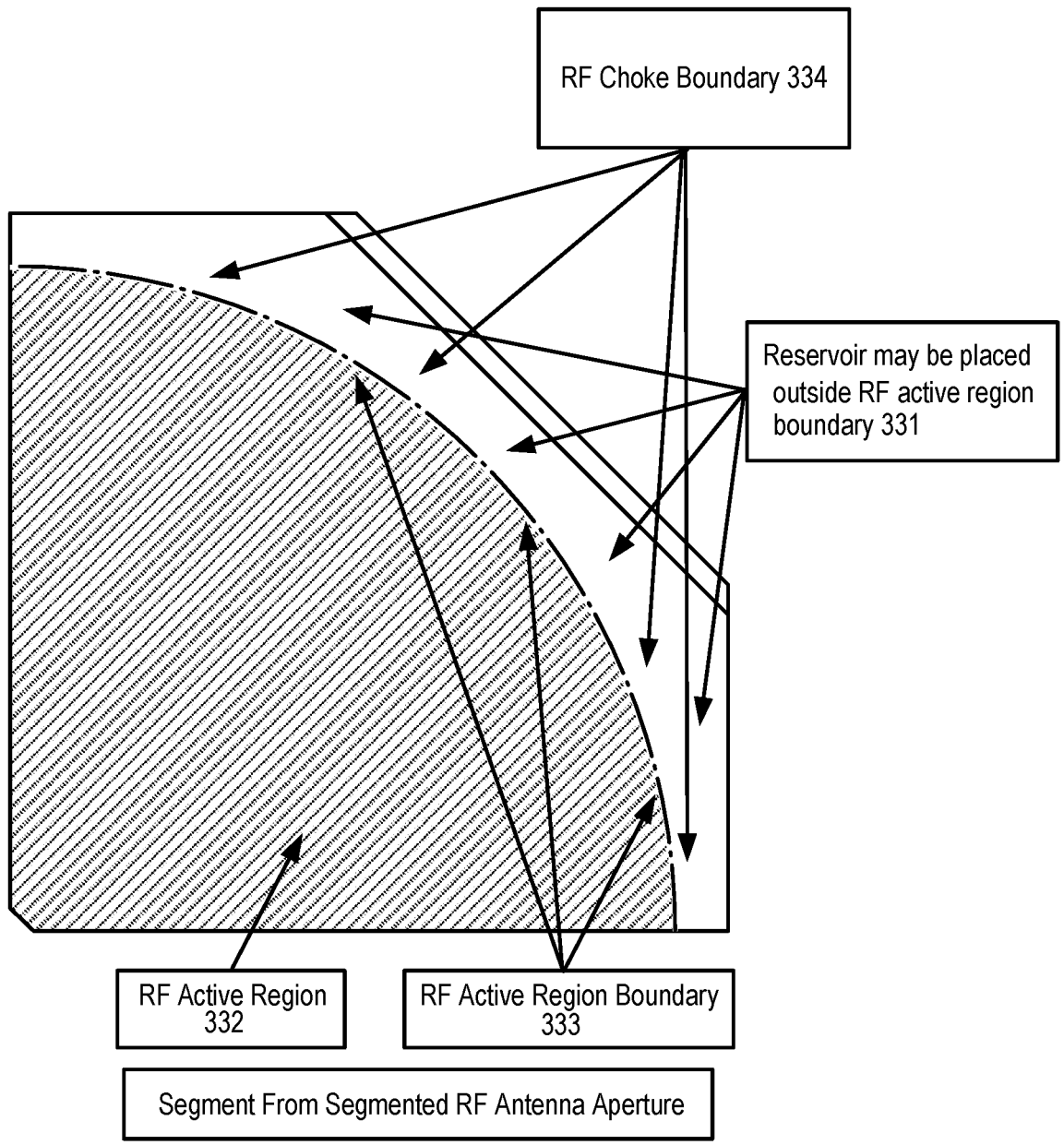

In one embodiment, there is more than one reservoir in an antenna aperture segment. In one embodiment, these structures are distributed at intervals outside of the outer choke ring boundary. In this embodiment, the LC is able to flow into the reservoir closest to the area of its origin-path of lowest resistance to flow. FIG. 3B illustrates such an example. Note that the choke prevents the escape of RF out the end of the radial feed antenna. If the iris metal (e.g., copper) is patterned, the removal of the iris metal is performed in such a way as to not affect the function of the iris metal as part of waveguide. Referring to FIG. 3B, a ring outside of the RF active region boundary 333 is choke boundary 334. In one embodiment, if iris metal is removed to increase LC reservoir volume, the iris metal is only removed outside of the choke ring boundary.

Thus, in one embodiment, the LC reservoir is constructed in RF inactive areas in an array where there is no continuous ground plane (due to iris metal removal) to instantiate a waveguide (e.g., the waveguide of FIG. 10) (e.g., outside the cylindrical boundary that defines the waveguide below the RF antenna element array. In other words, the portion of LC reservoir where the iris metal is removed is in areas of the antenna aperture that are not over the waveguide beneath the RF active area containing the RF antenna elements. In one embodiment, these areas are outside the choke ring. In another embodiment, a portion of the LC reservoir where the portion inside this boundary has iris metal while the portion outside the boundary has the iris metal removed.

Figure 11:
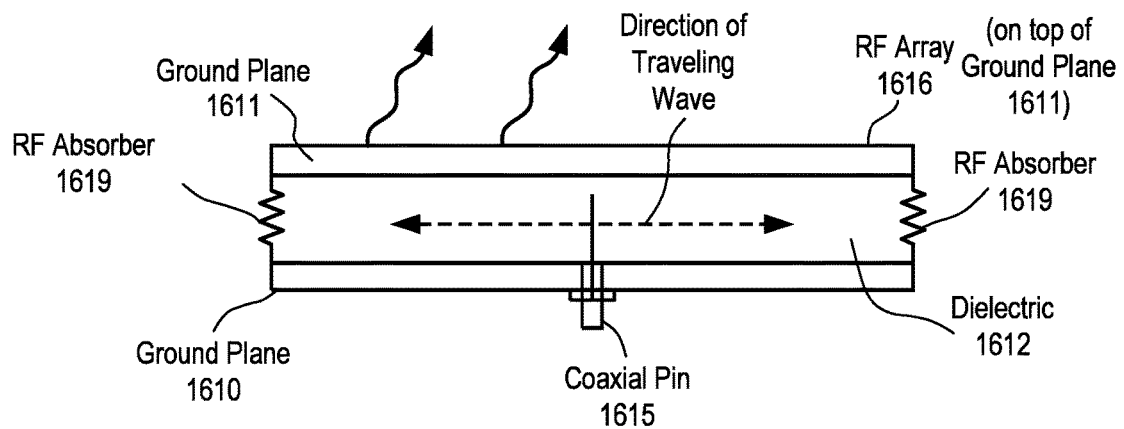
FIG. 11 illustrates another embodiment of the antenna system with an outgoing wave.

In an alternative antenna implementation with a center-fed design such as, for example, in FIG. 11, an RF absorber, instead of a choke structure, is used at the boundary of the antenna array. In such a case, the LC reservoir is in the area outside of the active area of antenna array that contains the antenna elements.

A Reservoir with One or More Voids

While decreasing the RF frequency shift versus temperature due to LC volume expansion described above provides a space empty of LC (a void/bubble area) within the RF aperture border seal to accommodate the LC volume increase during expansion, and conversely, provides a source of LC during a contraction of LC volume when temperature decreases, generally the empty space (void-bubble) described above is not within the RF antenna quality area or within the RF antenna elements.

Figure 6A:
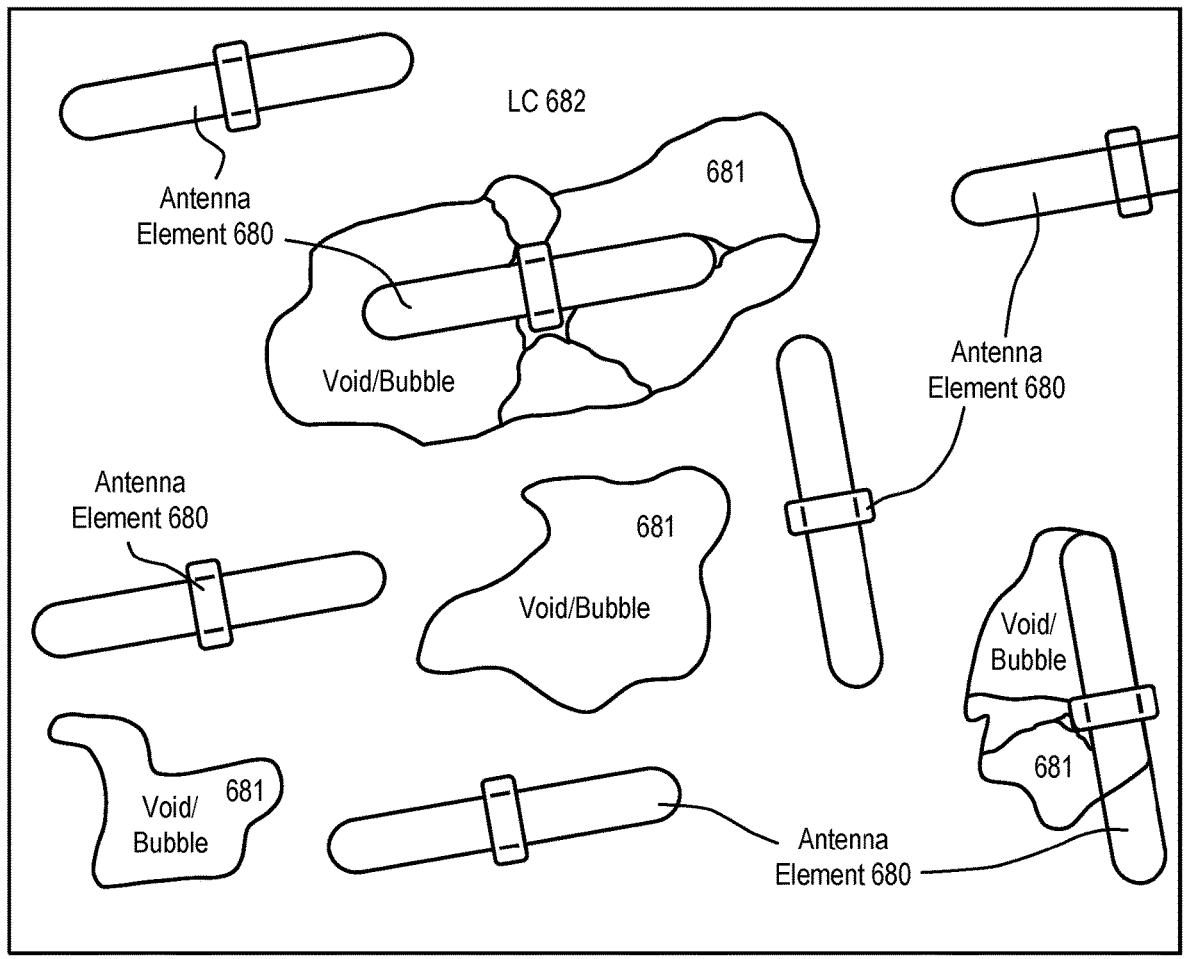
FIG. 6A illustrates a portion of an antenna aperture having antenna elements with LC around and within the antenna elements.

However, in one embodiment, the LC reservoir, including such voids or bubbles, is included in the RF antenna quality area (or at least includes all or portion of the RF antenna quality area) and could even be within one or more RF antenna elements. FIG. 6A illustrates a portion of an antenna aperture having antenna elements 680 with LC 682 around and within antenna elements 680. In one embodiment, LC 682 is between two substrates that include patches and irises that overlap each other. Some of LC 682 is within the patch/iris overlap areas. One or more void areas or bubbles 681 may be located within RF antenna functional or quality area such that void areas or bubbles 681 are located among the one or more of antenna elements 680. In fact, a void area 681 may extend into proximity of the patch/iris overlap region. However, as long as that patch/iris overlap region contains LC as well, then the antenna element operates in a stable manner. Thus, as disclosed herein, there are RF antenna element structures that, once the LC has been placed between the patch/iris overlap region of an antenna element where the LC volume is sufficient in volume and stable enough, operate properly despite bubbles-voids forming near or in some parts of an RF element or even voids-bubbles moving into areas adjacent to the patch/iris overlap regions of the RF antenna elements. This is true whether the encroachment of the void-bubble has been the result of construction methods or mechanical, thermal or other stresses applied to the RF antenna device.

Advantages of this type of device are multifold. One advantage is that the voids can be placed in the RF antenna functional area, such that the LC does not need to travel far to enter the reservoir regions. This improves the time response of the temperature compensation and alleviates concerns over LC back pressure during rapid rises in temperature. Secondly, as long as the LC is initially wetted between the patch and iris elements, the process of placing the void-bubbles into the aperture or segment is greatly simplified. The LC need only be placed to cover the RF antenna elements in the initial step. After this step, since the LC will stably remain between patch and iris elements, no special care regarding the void-bubble location is required as it can move to the lowest energy location. This allows the LC reservoir around the antenna elements to be underfilled as only a smaller amount of LC needs to be placed in the patch/iris overlap region for the antenna element to operate. Construction of special features such as wetting structures, liquid crystal containment structures, and structures to place the bubble-voids in specific locations outside of the RF quality area, and the process steps required to produce such structures, can be eliminated as long as the LC wetting of the iris/patch overlap is maintained (i.e., as long as the LC is in the iris/patch overlap region).

More particularly, in the radiating RF antenna elements disclosed herein, LC is placed between upper and lower electrodes (e.g., the patch and iris metal electrodes) located on two parallel substrates, where the size of the RF antenna elements, the physical space between the RF elements (density of the elements) and the topology of the elements (thickness of the metal and dielectric layers forming the RF antenna elements) are very different from the pixels (picture elements) of LCD displays. A void/bubble may exist in the quality area in the large regions between RF antenna elements without impacting RF element performance.

Furthermore, a void-bubble may exist within the RF antenna element itself without affecting the performance as long as the patch/iris overlap region of the RF antenna element itself is occupied with LC and LC is not absent from the region between the overlapping metal layers. This is because the change in capacitance (and thus the RF frequency) from the on-state to the off-state of the RF antenna element is almost entirely from the switching of the LC between the overlapping electrodes. Were the RF element completely immersed in LC, there would be a small additional amount of capacitance due to LC switching in the fringing fields between the patch and iris electrodes, but this not a large enough effect to significantly shift the frequency.

Once the LC is wetted within the iris/patch overlap region, it is possible for voids/bubbles to form between RF antenna elements or within RF antenna elements, near or along edges of the patch/iris overlap regions of the RF antenna element. The formation of such empty spaces can result in movement of LC within the RF aperture after the initial formation of the voids-bubbles, particularly to accommodate LC volume expansion. For example, it may be thermodynamically favorable for a net movement of LC into a void-bubble area within the RF aperture/segment, creating a void/bubble elsewhere. The position of the resulting void may be around an RF antenna element or inside the RF antenna element.

Further, LC/void-bubble movement may be assisted by, or result from, expansion and contraction of the LC, action by mechanical forces on the RF aperture/segment, etc. As long as LC remains within the patch/iris overlap regions of the RF antenna, the movement of LC into and out of voids/bubbles areas elsewhere has minimal impact on the proper function of the RF antenna elements.

In one embodiment, the topology and structure of the RF antenna element, along with wetting forces, are used to stabilize the LC volume within the patch/iris overlap area. In one embodiment, once the LC is deposited within the overlap region between the iris and patch portions of RF element, the state of LC in the overlap region is at an energy minimum, with a large activation energy barrier required to move the LC out of the overlap region.

Compared with an LCD pixel, in one embodiment, the metal layer thicknesses required of the patch and iris electrodes by the RF antenna elements are at least ten times thicker than the corresponding layers in an LCD. In one embodiment, the thickness of the patch/iris electrodes is up to a few microns in thickness. Also, the dielectric passivation thicknesses over these electrodes are relatively thinner than in an LCD (e.g., a thickness of less than 0.2 um); thus, the ability of the passivation layers to planarize the steps at the metal edges is negligible.

As LC volumes (and correspondingly, void-bubbles) move within the RF active area of segment, the edges formed by the topology of the patch and iris metal layers enable contact line pinning of the liquid crystal/void-bubble interface at one or more of the patch and iris layer edges. This resists LC movement out of the patch/iris overlap of the RF antenna element. This resistance is increased by the smaller gap between the patch and iris surfaces in the patch/iris overlap region. Resistance to flow will be inversely proportional to the gap height and the gap height will be reduced by up to 33% (or even 50%) in the patch/iris overlap region.

In one embodiment, contact line pinning comes from the energetics of the wetting angles at the iris and patch metal edges. In one embodiment, contact line pinning comes from the energetics of the wetting angles at the LC-polyimide (PI) layer-void interfaces on the iris and patch metal edges. The energy required to move LC out of the patch/iris overlap region is a function of the energy required to overcome the contact edge pinning barrier at the edges of the iris/metal overlap region. Thus, the patch and iris metal edges provide an energy barrier to the movement of LC from the iris/metal overlap region.

Figure 6B:
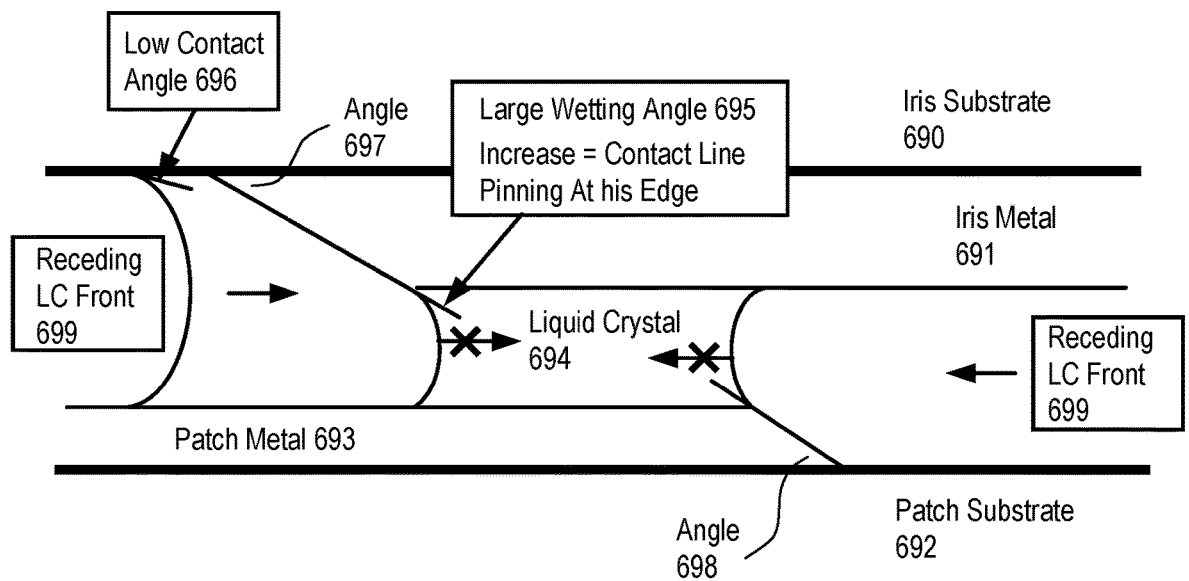
FIG. 6B illustrates one embodiment of a patch/iris overlap region of two substrates used to form antenna elements of an antenna aperture.

FIG. 6B illustrates one embodiment of a patch/iris overlap region of two substrates used to form antenna elements of an antenna aperture. Referring to FIG. 6B, an iris substrate 690 has an iris metal layer 691 fabricated on it. Iris metal layer 691 is an electrode of the antenna element. A patch substrate 692 has patch metal layer 693 fabricated on it. LC 694 is between iris substrate 690 and patch substrate 692, including in the overlap region where iris metal layer 691 and patch metal layer 693 overlap with other. Either or both of patch metal layer 693 and iris metal layer 691 may have a polyimide (PI) layer and/or a silicon nitride ($SiN_x$) layer fabricated on (e.g., deposited) or otherwise attached to the top of them.

A receding LC front 699 corresponds to the LC that recedes from the antenna element into a reservoir that may contain one or more voids and compensates for LC expansion as described above. Receding LC front 699 has a low contact angle 696 with iris substrate 690. The same or similar low contact angle occurs between receding LC front 699 and patch metal layer 693. Both iris metal layer 691 and patch metal layer 693 have edges with angles 697 and 698, respectively. In one embodiment, these angles are at least 25°. In one embodiment, the maximum these angles are is 90°. The angle of the edges of at least one of iris metal layer 691 and patch metal layer 693 creates a large wetting angle. As shown, iris metal layer 691 and patch metal layer 693 cause contact angle 695 to assume a value typically less than 90 degrees such that any discontinuity requires the LC to change the shape of its front to continue moving. That requires energy, and it's that energy barrier that pins the LC. Thus, contact line pinning in an RF antenna element patch/iris overlap region occurs to hold LC 694 between iris metal layer 691 and patch metal layer 693. That is, the liquid crystal is pinned, because for it to move further along metal layer 691 would require this wetting angle to be maintained along the slanted surface of metal layer 691. More specifically, the contact angle is primarily a property of the materials—the surface (PI) and the LC. It is the resultant of the balance between the surface tension and the wetting forces between these materials. The materials used for these types of alignment layers are usually low contact angles—much less than 90. The LC pins because further movement past the edges of iris metal layer 691 (e.g., a copper etch edge) would create a large wetting angle, which is energetically unfavorable: kinetically unfavorable-requires overcoming an energy barrier for the LC to move further. Therefore, the LC will not move past this edge without an investment of energy. The wetting angle could vary greatly, but there would still be a large angle increase and thus not favorable energetically.

The combination of the low LC/patch metal (with PI) wetting angle, with the steep angle of the patch and iris edge topology, form a large enough energy barrier to stabilize the LC volume within the patch/iris overlap regions versus void-bubble movement into the overlap region. In one embodiment, stabilization is enhanced by decreasing the LC-PI-void wetting angle and increasing the steepness of the taper angle (e.g., angles 697 and 698) of the patch and iris metal edges (resulting from the metal etching processes) and the step thickness of the patch metal layer 693 and iris metal layer 691. In one embodiment, the step thickness is determined by the patch and iris metal thickness. In one embodiment, the step thickness can be up to few microns. In one embodiment, the steepness of the taper angle is around 25 degrees.

The tendency of the LC to remain within the patch/iris overlap area is a result of thermodynamic and capillarity forces. The trapping of LC in the patch/iris overlap area occurs because the surface energies of the substrates and the substrate—LC interface set the lowest potential energy contact angle of the LC. Surmounting an edge, for example the edge associated with the patch metal layer 693, would require the contact angle to change, and this is resisted by the LC surface tension. Consequently, the receding LC front 699, which had been flowing, is stopped at discontinuities.

Thus, in one embodiment, an antenna disclosed herein has an antenna element array and a reservoir structure to hold LC. The antenna element array has a plurality of radiating radio-frequency (RF) antenna elements formed using portions of first and second substrates with LC therebetween, where the first substrate comprises a plurality of irises and the second substrate comprises a plurality of patches, wherein each of the patches is co-located over and separated from an iris in the plurality of irises, with LC at least partially between each overlap region a patch and iris overlap. The reservoir structure between the first and second substrates has areas around the RF antenna elements, and has a cavity large enough to accommodate thermal expansion of the LC and one or more areas void of LC, wherein LC remains in patch/iris overlap regions of the plurality of radiating RF antenna elements even when additional LC could enter the one or more areas void of LC due to contact line pinning. Thus, the structures of the antenna elements cause the LC to remain with the patch/iris overlap region.

In one embodiment, further stabilization of the LC in the patch/iris overlap is accomplished. In one embodiment, this stabilization is accomplished by improving the wetting of the LC within the RF antenna element. In this embodiment, the wetting of LC in this region is improved by removing the PI and $SiN_x$ layers from the patch metal in the patch metal/iris glass overlap portion of the RF antenna element. While the PI and $SiN_x$ layers are important in the patch metal/iris metal overlap regions, this is not the case in the patch metal/iris glass overlap portion of the RF antenna element. Metal layers have very high surface energies compared with $SiN_x$ and PI. By removing these SiNx and PI alignment layers from the patch metal/iris glass overlap portion of the RF antenna element and exposing the top patch metal, wetting to the patch metal/iris glass overlap portion of the RF antenna element would be greatly increased (with a potential energy decrease), thereby presenting an even greater energy barrier to movement of LC out of the patch/iris metal overlap regions.

Figure 7A:
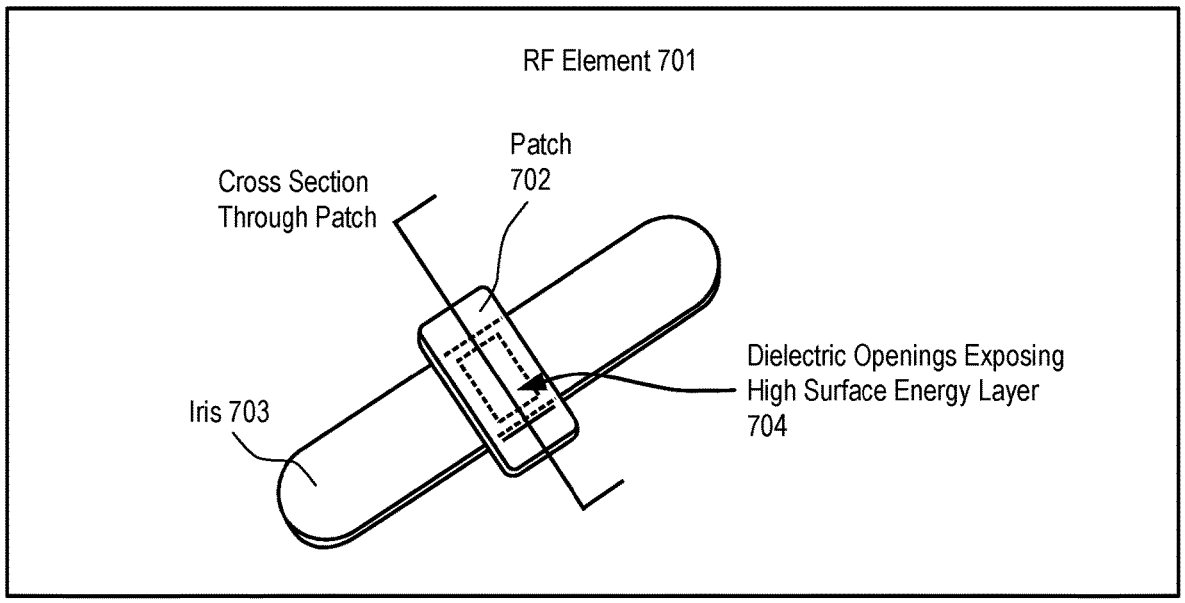
FIGS. 7A and 7B illustrate an RF element and its cross section with improved LC stabilization.
Figure 7B:
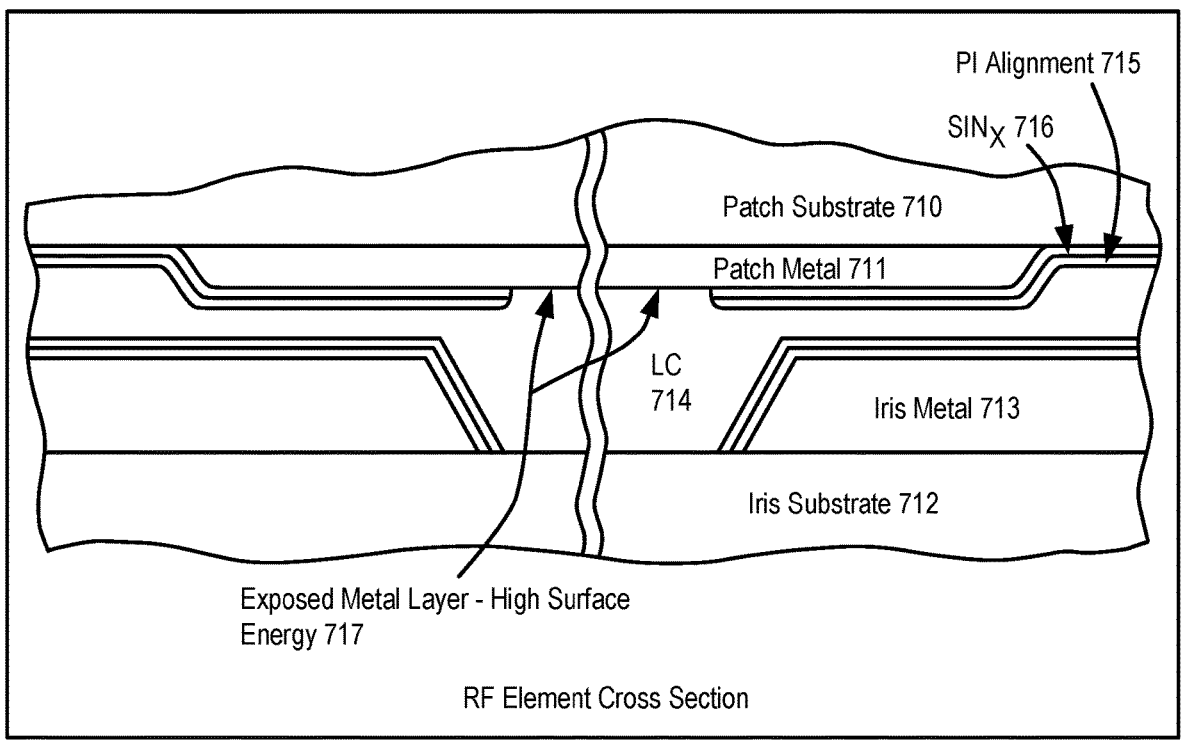

FIGS. 7A and 7B illustrate an RF element and its cross section with improved LC stabilization. Referring to FIG. 7A, an RF element 701 is shown having a patch 702 and an iris 703. A dielectric opening 704 that contains LC exposes a high surface energy layer.

FIG. 7B is a cross section of the RF element 701 of FIG. 7A through patch 702 (based on the line in FIG. 7A). Referring to FIG. 7B, patch substrate 710 includes a patch metal layer (electrode) 711 fabricated on it and iris substrate 712 includes an iris metal layer (electrode) 713 fabricated on it. LC 714 is between patch substrate 710 and iris substrate 712.

Patch metal layer 711 includes a silicon nitride ($SiN_x$) layer 716 and a PI alignment layer 715 fabricated on a portion of it. In one embodiment, the silicon nitride ($SiN_x$) PI alignment layers are also on the iris metal layer. However, an exposed portion 717 of patch metal layer 711 is not covered by silicon nitride ($SiN_x$) layer 716 and PI alignment layer 715 and thus is exposed. In one embodiment, silicon nitride ($SiN_x$) layer 716 and PI alignment layer 715 are fabricated over the entire surface of patch metal layer 711 and then a portion of silicon nitride ($SiN_x$) layer 716 and PI alignment layer 715 are removed (e.g., etched) to expose patch metal layer 711.

Exposed patch metal layer 717 improves the wetting of LC 714 within the RF antenna element because exposed patch metal layer 717 has a very high surface energy compared to silicon nitride (SiNx) layer 716 and PI alignment layer 715. By removing silicon nitride (SiNx) layer 716 and PI alignment layer 715 from the patch metal/iris glass overlap portion of the RF antenna element and exposing the top of patch metal layer 711, the wetting to the patch/iris overlap regions of the RF antenna elements is increased and creates a greater energy barrier to movement of LC out of the patch/iris metal overlap regions.

Thus, in one embodiment, stabilization of LC within the iris/patch overlap regions of the RF elements occurs by the addition of structures near the iris/patch overlap regions, but outside of the RF overlap regions themselves, as well as by including wetting structures of high surface energy materials, and physical structures such as contact line pinning structures.

Examples of Antenna Embodiments

The LC reservoir described above may be used in a number of antenna embodiments, including, but not limited to, flat panel antennas. Embodiments of such flat panel antennas are disclosed. The flat panel antennas include one or more arrays of antenna elements on an antenna aperture. In one embodiment, the antenna elements comprise liquid crystal cells. In one embodiment, the flat panel antenna is a cylindrically fed antenna that includes matrix drive circuitry to uniquely address and drive each of the antenna elements that are not placed in rows and columns. In one embodiment, the elements are placed in rings.

In one embodiment, the antenna aperture having the one or more arrays of antenna elements is comprised of multiple segments coupled together. When coupled together, the combination of the segments form closed concentric rings of antenna elements. In one embodiment, the concentric rings are concentric with respect to the antenna feed.

Examples of Antenna Systems

In one embodiment, the flat panel antenna is part of a metamaterial antenna system. Embodiments of a metamaterial antenna system for communications satellite earth stations are described. In one embodiment, the antenna system is a component or subsystem of a satellite earth station (ES) operating on a mobile platform (e.g., aeronautical, maritime, land, etc.) that operates using either Ka-band frequencies or Ku-band frequencies for civil commercial satellite communications. Note that embodiments of the antenna system also can be used in earth stations that are not on mobile platforms (e.g., fixed or transportable earth stations).

In one embodiment, the antenna system uses surface scattering metamaterial technology to form and steer transmit and receive beams through separate antennas. In one embodiment, the antenna systems are analog systems, in contrast to antenna systems that employ digital signal processing to electrically form and steer beams (such as phased array antennas).

In one embodiment, the antenna system is comprised of three functional subsystems: (1) a wave guiding structure consisting of a cylindrical wave feed architecture; (2) an array of wave scattering metamaterial unit cells that are part of antenna elements; and (3) a control structure to command formation of an adjustable radiation field (beam) from the metamaterial scattering elements using holographic principles.

Antenna Elements

Figure 8A:
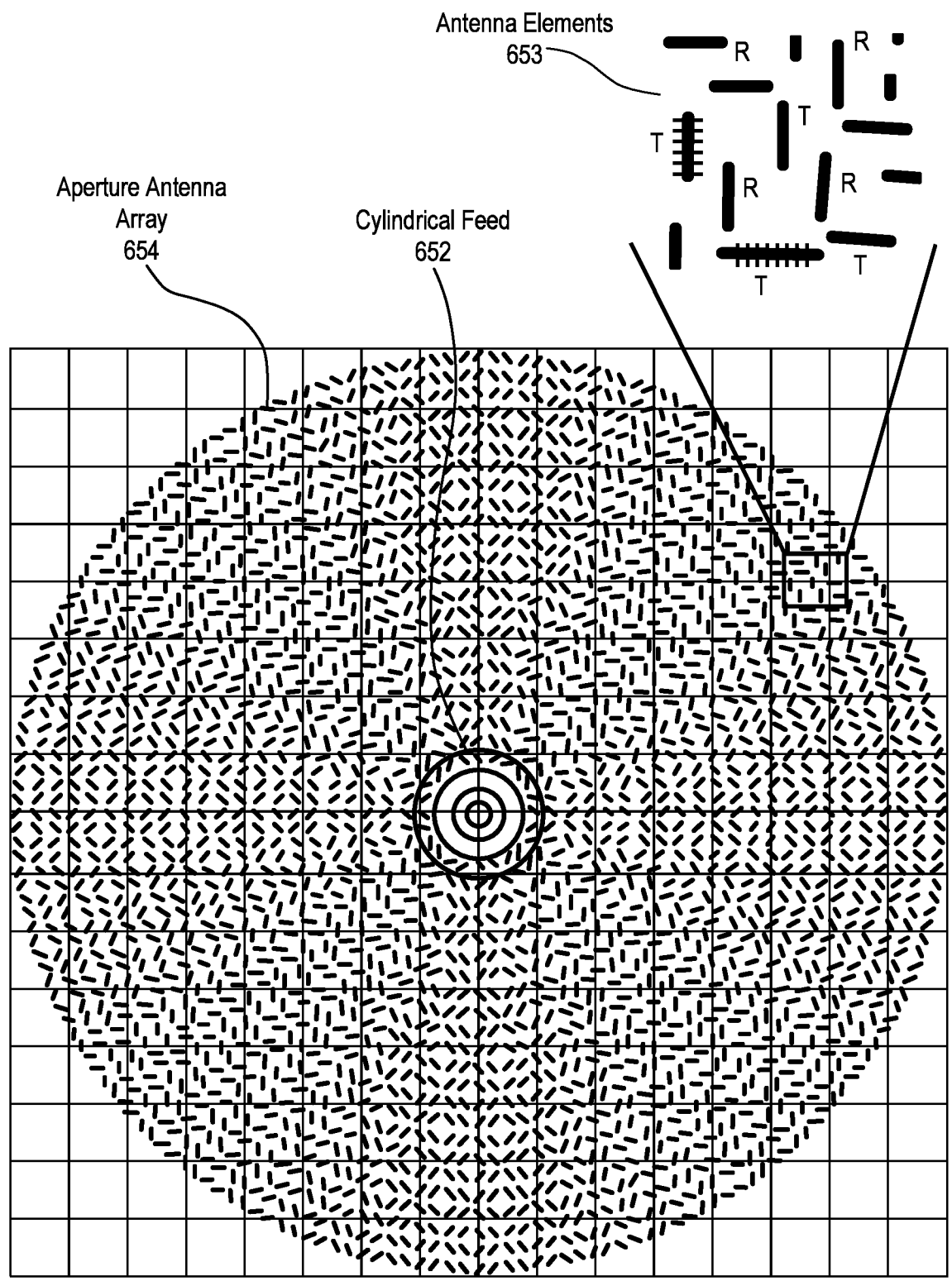
FIG. 8A illustrates the schematic of one embodiment of a cylindrically fed holographic radial aperture antenna.

FIG. 8A illustrates the schematic of one embodiment of a cylindrically fed holographic radial aperture antenna. Referring to FIG. 8A, the antenna aperture has one or more arrays 651 of antenna elements 653 that are placed in concentric rings around an input feed 652 of the cylindrically fed antenna. In one embodiment, antenna elements 653 are radio frequency (RF) resonators that radiate RF energy. In one embodiment, antenna elements 653 comprise both Rx and Tx irises that are interleaved and distributed on the whole surface of the antenna aperture. Examples of such antenna elements are described in greater detail below. Note that the RF resonators described herein may be used in antennas that do not include a cylindrical feed.

In one embodiment, the antenna includes a coaxial feed that is used to provide a cylindrical wave feed via input feed 652. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In one embodiment, antenna elements 653 comprise irises and the aperture antenna of FIG. 8A is used to generate a main beam shaped by using excitation from a cylindrical feed wave for radiating irises through tunable liquid crystal (LC) material. In one embodiment, the antenna can be excited to radiate a horizontally or vertically polarized electric field at desired scan angles.

In one embodiment, the antenna elements comprise a group of patch antennas. This group of patch antennas comprises an array of scattering metamaterial elements. In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As would be understood by those skilled in the art, LC in the context of CELC refers to inductance-capacitance, as opposed to liquid crystal.

In one embodiment, a liquid crystal (LC) is disposed in the gap around the scattering element. This LC is driven by the direct drive embodiments described above. In one embodiment, liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one embodiment, the liquid crystal integrates an on/off switch for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one embodiment, the feed geometry of this antenna system allows the antenna elements to be positioned at forty-five degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

In one embodiment, as discussed above, a matrix drive is used to apply voltage to the patches in order to drive each cell separately from all the other cells without having a separate connection for each cell (direct drive). Because of the high density of elements, the matrix drive is an efficient way to address each cell individually.

In one embodiment, the control structure for the antenna system has 2 main components: the antenna array controller, which includes drive electronics, for the antenna system, is below the wave scattering structure, while the matrix drive switching array is interspersed throughout the radiating RF array in such a way as to not interfere with the radiation. In one embodiment, the drive electronics for the antenna system comprise commercial off-the shelf LCD controls used in commercial television appliances that adjust the bias voltage for each scattering element by adjusting the amplitude or duty cycle of an AC bias signal to that element.

In one embodiment, the antenna array controller also contains a microprocessor executing the software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which elements are turned off and those elements turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one embodiment, the antenna system produces one steerable beam for the uplink antenna and one steerable beam for the downlink antenna. In one embodiment, the antenna system uses metamaterial technology to receive beams and to decode signals from the satellite and to form transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Figure 8B:
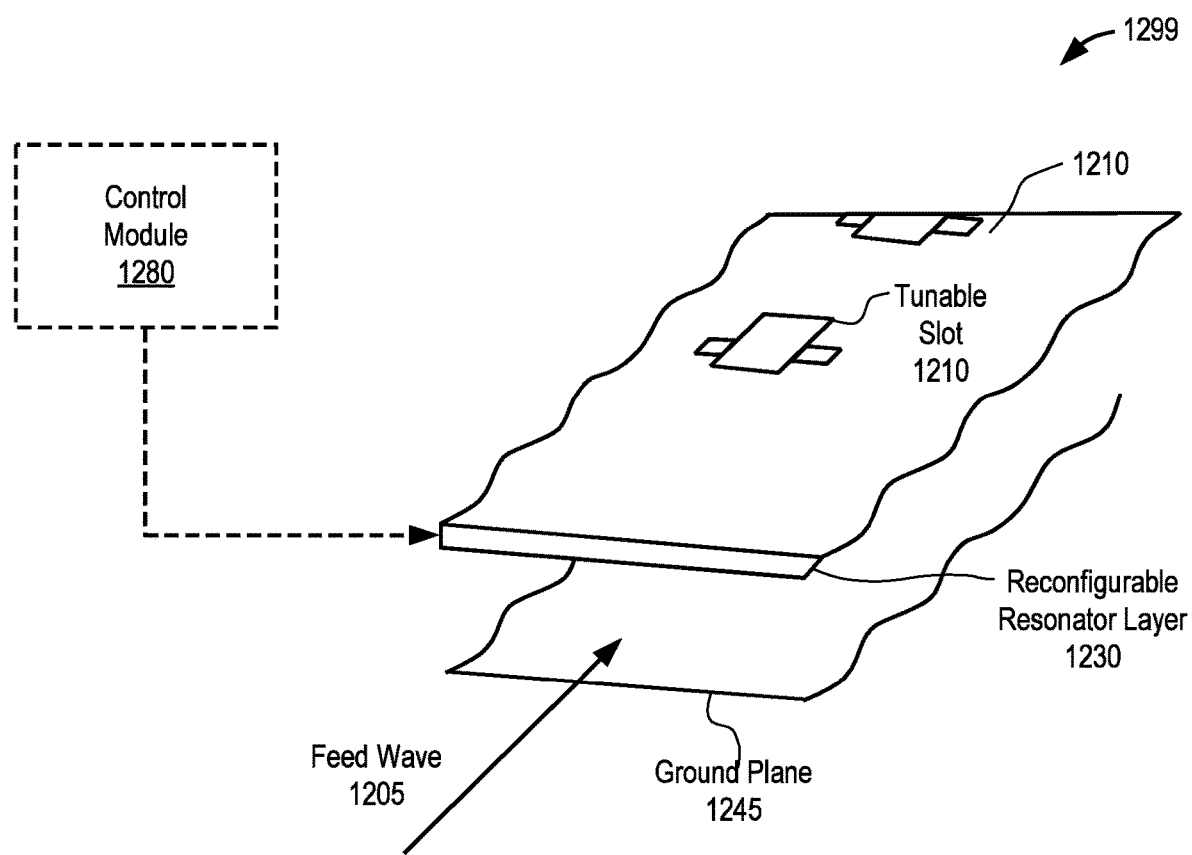
FIG. 8B illustrates a perspective view of one row of antenna elements that includes a ground plane and a reconfigurable resonator layer.

FIG. 8B illustrates a perspective view of one row of antenna elements that includes a ground plane and a reconfigurable resonator layer. Reconfigurable resonator layer 1230 includes an array of tunable slots 1210. The array of tunable slots 1210 can be configured to point the antenna in a desired direction. Each of the tunable slots can be tuned/adjusted by varying a voltage across the liquid crystal.

Figure 8C:
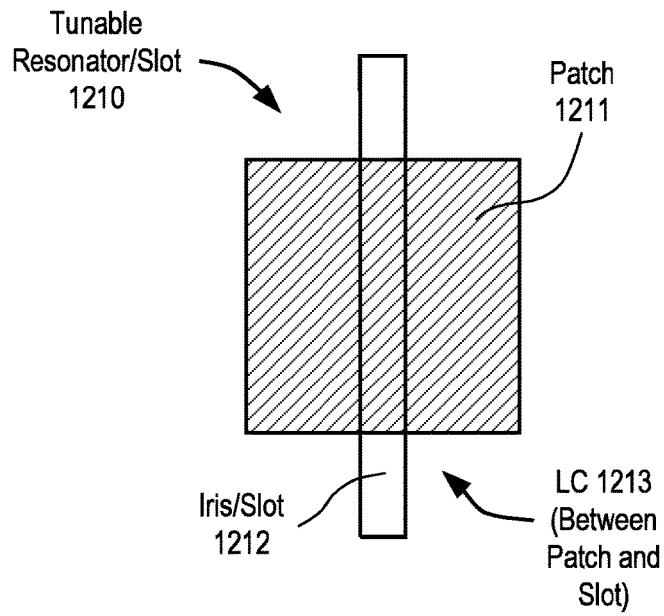
FIG. 8C illustrates one embodiment of a tunable resonator/slot.

Control module 1280 is coupled to reconfigurable resonator layer 1230 to modulate the array of tunable slots 1210 by varying the voltage across the liquid crystal in FIG. 8C. Control module 1280 may include a Field Programmable Gate Array ("FPGA"), a microprocessor, a controller, System-on-a-Chip (SoC), or other processing logic. In one embodiment, control module 1280 includes logic circuitry (e.g., multiplexer) to drive the array of tunable slots 1210. In one embodiment, control module 1280 receives data that includes specifications for a holographic diffraction pattern to be driven onto the array of tunable slots 1210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 1280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 1205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 1210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram} = w^*_{in} w_{out}$, with $w_{in}$ as the wave equation in the waveguide and $w_{out}$ the wave equation on the outgoing wave.

FIG. 8C illustrates one embodiment of a tunable resonator/slot 1210. Tunable slot 1210 includes an iris/slot 1212, a radiating patch 1211, and liquid crystal 1213 disposed between iris 1212 and patch 1211. In one embodiment, radiating patch 1211 is co-located with iris 1212.

Figure 8D:
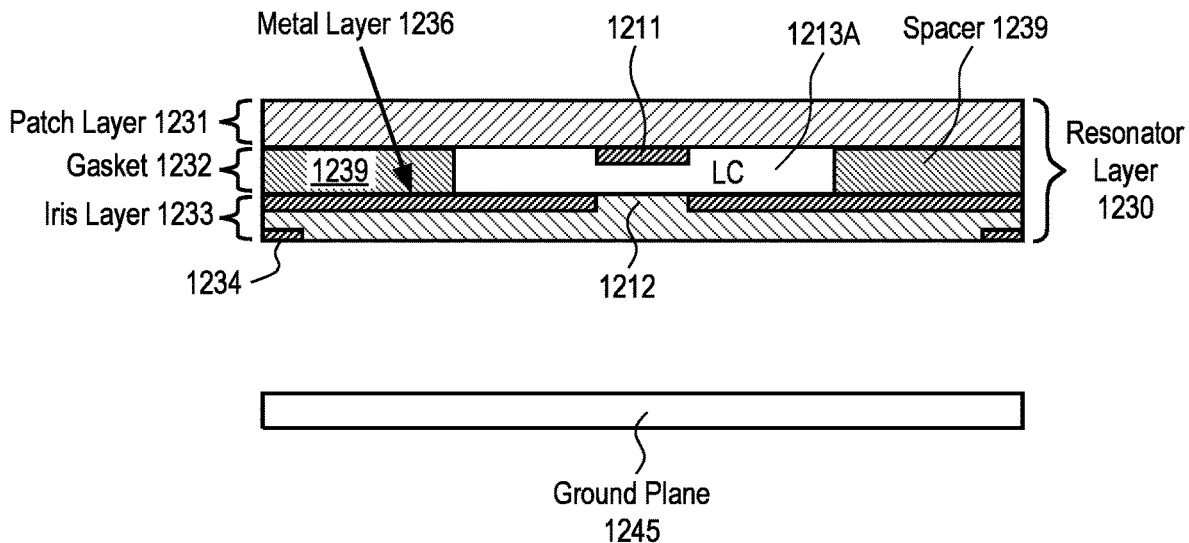
FIG. 8D illustrates a cross section view of one embodiment of a physical antenna aperture.

FIG. 8D illustrates a cross section view of one embodiment of a physical antenna aperture. The antenna aperture includes ground plane 1245, and a metal layer 1236 within iris layer 1233, which is included in reconfigurable resonator layer 1230. In one embodiment, the antenna aperture of FIG. 8D includes a plurality of tunable resonator/slots 1210 of FIG. 8C. Iris/slot 1212 is defined by openings in metal layer 1236. A feed wave, such as feed wave 1205 of FIG. 8C, may have a microwave frequency compatible with satellite communication channels. The feed wave propagates between ground plane 1245 and resonator layer 1230.

Reconfigurable resonator layer 1230 also includes gasket layer 1232 and patch layer 1231. Gasket layer 1232 is disposed between patch layer 1231 and iris layer 1233. Note that in one embodiment, a spacer could replace gasket layer 1232. In one embodiment, iris layer 1233 is a printed circuit board ("PCB") that includes a copper layer as metal layer 1236. In one embodiment, iris layer 1233 is glass. Iris layer 1233 may be other types of substrates.

Openings may be etched in the copper layer to form slots 1212. In one embodiment, iris layer 1233 is conductively coupled by a conductive bonding layer to another structure (e.g., a waveguide) in FIG. 8D. Note that in an embodiment the iris layer is not conductively coupled by a conductive bonding layer and is instead interfaced with a non-conducting bonding layer.

Patch layer 1231 may also be a PCB that includes metal as radiating patches 1211. In one embodiment, gasket layer 1232 includes spacers 1239 that provide a mechanical standoff to define the dimension between metal layer 1236 and patch 1211. In one embodiment, the spacers are 75 microns, but other sizes may be used (e.g., 3-200 mm). As mentioned above, in one embodiment, the antenna aperture of FIG. 8D includes multiple tunable resonator/slots, such as tunable resonator/slot 1210 includes patch 1211, liquid crystal 1213, and iris 1212 of FIG. 8C. The chamber for liquid crystal 1213 is defined by spacers 1239, iris layer 1233 and metal layer 1236. When the chamber is filled with liquid crystal, patch layer 1231 can be laminated onto spacers 1239 to seal liquid crystal within resonator layer 1230.

A voltage between patch layer 1231 and iris layer 1233 can be modulated to tune the liquid crystal in the gap between the patch and the slots (e.g., tunable resonator/slot 1210). Adjusting the voltage across liquid crystal 1213 varies the capacitance of a slot (e.g., tunable resonator/slot 1210). Accordingly, the reactance of a slot (e.g., tunable resonator/slot 1210) can be varied by changing the capacitance. The resonant frequency of slot 1210 also changes according to the equation $$f = \frac{1}{2\pi\sqrt{LC}},$$

where $j$ is the resonant frequency of slot 1210 and L and C are the inductance and capacitance of slot 1210, respectively. The resonant frequency of slot 1210 affects the energy radiated from feed wave 1205 propagating through the waveguide. As an example, if feed wave 1205 is 20 GHz, the resonant frequency of a slot 1210 may be adjusted (by varying the capacitance) to 17 GHz so that the slot 1210 couples substantially no energy from feed wave 1205. Or, the resonant frequency of a slot 1210 may be adjusted to 20 GHz so that the slot 1210 couples energy from feed wave 1205 and radiates that energy into free space. Although the examples given are binary (fully radiating or not radiating at all), full gray scale control of the reactance, and therefore the resonant frequency of slot 1210 is possible with voltage variance over a multi-valued range. Hence, the energy radiated from each slot 1210 can be finely controlled so that detailed holographic diffraction patterns can be formed by the array of tunable slots.

In one embodiment, tunable slots in a row are spaced from each other by $\lambda/5$. Other spacings may be used. In one embodiment, each tunable slot in a row is spaced from the closest tunable slot in an adjacent row by $\lambda/2$, and, thus, commonly oriented tunable slots in different rows are spaced by $\lambda/4$, though other spacings are possible (e.g., $\lambda/5$, $\lambda/6.3$). In another embodiment, each tunable slot in a row is spaced from the closest tunable slot in an adjacent row by $\lambda/3$.

Embodiments use reconfigurable metamaterial technology, such as described in U.S. patent application Ser. No. 14/550,178, entitled "Dynamic Polarization and Coupling Control from a Steerable Cylindrically Fed Holographic Antenna", filed Nov. 21, 2014 and U.S. patent application Ser. No. 14/610,502, entitled "Ridged Waveguide Feed Structures for Reconfigurable Antenna", filed Jan. 30, 2015.

FIGS. 9A-D illustrate one embodiment of the different layers for creating the slotted array. The antenna array includes antenna elements that are positioned in rings, such as the example rings shown in FIG. 8A. Note that in this example the antenna array has two different types of antenna elements that are used for two different types of frequency bands.

Figure 9A:
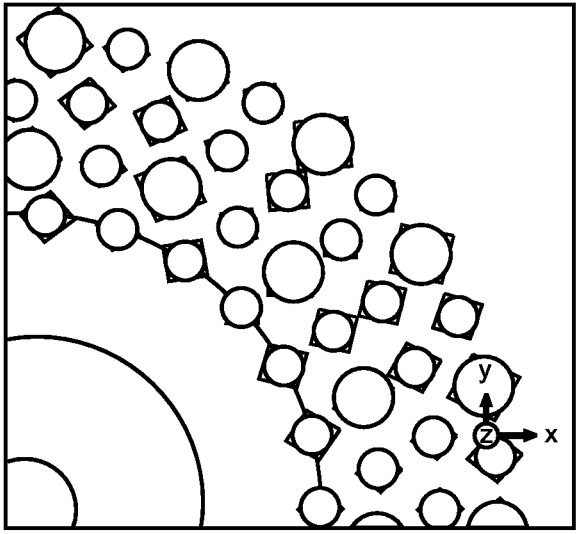
FIGS. 9A-D illustrate one embodiment of the different layers for creating the slotted array.
Figure 9B:
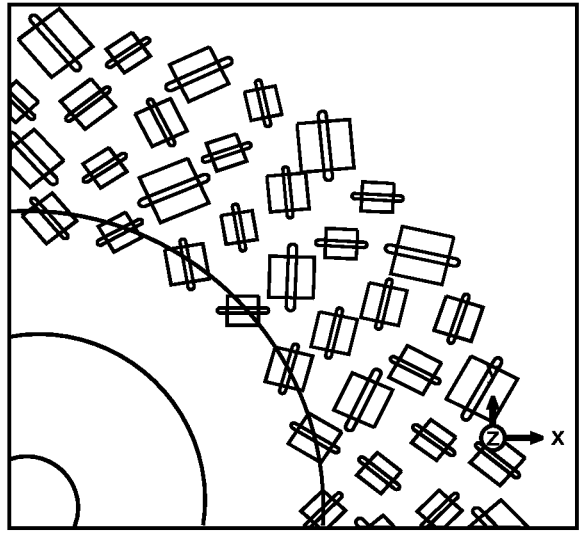
Figure 9C:
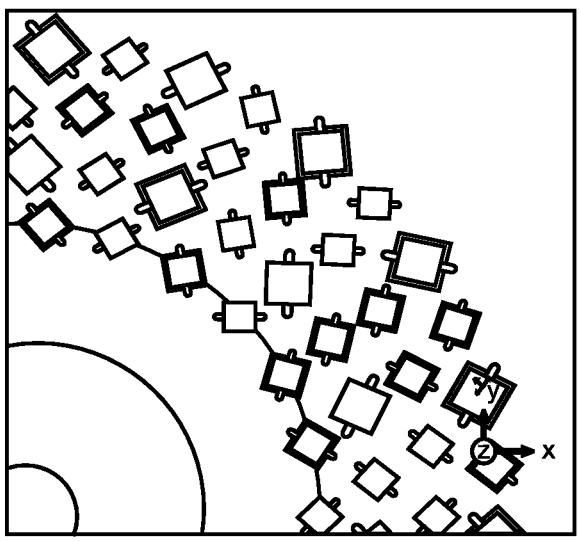
Figure 9D:
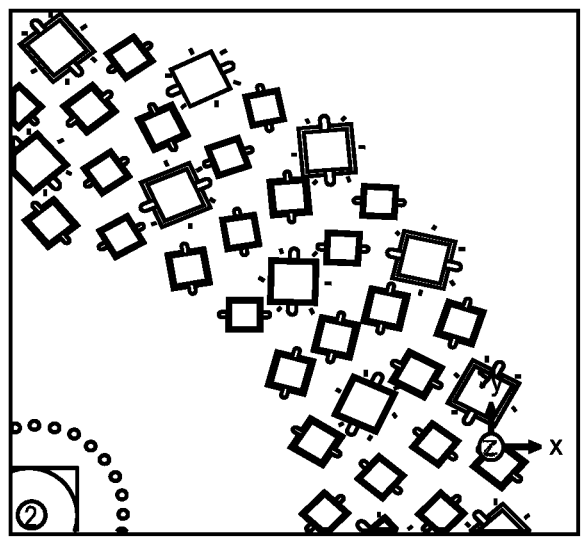

FIG. 9A illustrates a portion of the first iris board layer with locations corresponding to the slots. Referring to FIG. 9A, the circles are open areas/slots in the metallization in the bottom side of the iris substrate, and are for controlling the coupling of elements to the feed (the feed wave). Note that this layer is an optional layer and is not used in all designs. FIG. 9B illustrates a portion of the second iris board layer containing slots. FIG. 9C illustrates patches over a portion of the second iris board layer. FIG. 9D illustrates a top view of a portion of the slotted array.

Figure 10:
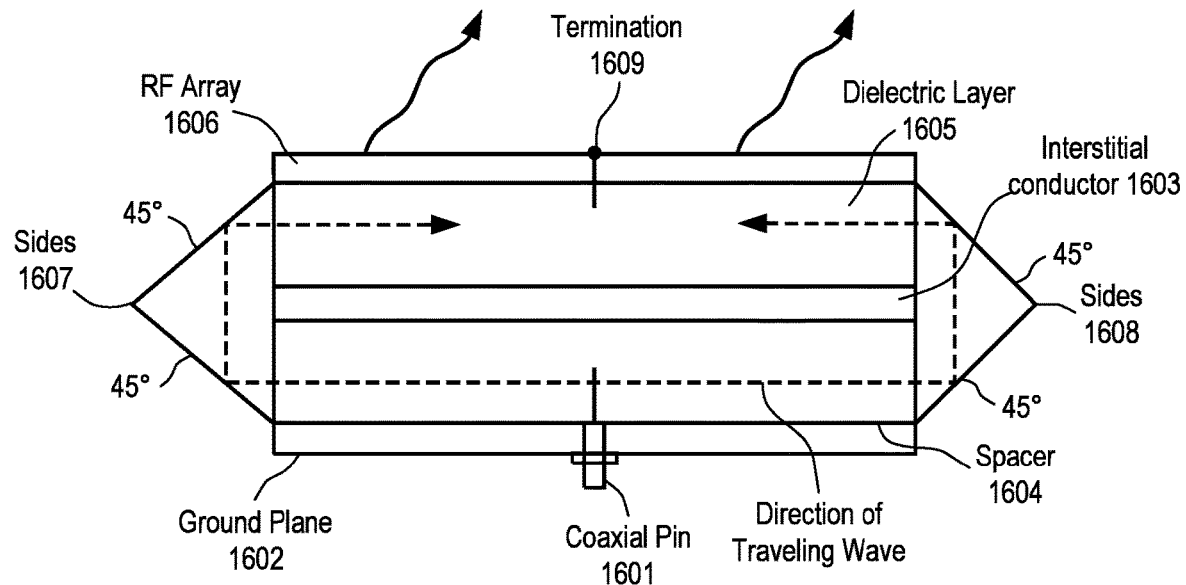
FIG. 10 illustrates a side view of one embodiment of a cylindrically fed antenna structure.

FIG. 10 illustrates a side view of one embodiment of a cylindrically fed antenna structure. The antenna produces an inwardly travelling wave using a double layer feed structure (i.e., two layers of a feed structure). In one embodiment, the antenna includes a circular outer shape, though this is not required. That is, non-circular inward travelling structures can be used. In one embodiment, the antenna structure in FIG. 10 includes a coaxial feed, such as, for example, described in U.S. Publication No. 2015/0236412, entitled "Dynamic Polarization and Coupling Control from a Steerable Cylindrically Fed Holographic Antenna", filed on Nov. 21, 2014.

Referring to FIG. 10, a coaxial pin 1601 is used to excite the field on the lower level of the antenna. In one embodiment, coaxial pin 1601 is a 50Ω coax pin that is readily available. Coaxial pin 1601 is coupled (e.g., bolted) to the bottom of the antenna structure, which is conducting ground plane 1602.

Separate from conducting ground plane 1602 is interstitial conductor 1603, which is an internal conductor. In one embodiment, conducting ground plane 1602 and interstitial conductor 1603 are parallel to each other. In one embodiment, the distance between ground plane 1602 and interstitial conductor 1603 is 0.1-0.15". In another embodiment, this distance may be λ/2, where λ is the wavelength of the travelling wave at the frequency of operation.

Ground plane 1602 is separated from interstitial conductor 1603 via a spacer 1604. In one embodiment, spacer 1604 is a foam or air-like spacer. In one embodiment, spacer 1604 comprises a plastic spacer.

On top of interstitial conductor 1603 is dielectric layer 1605. In one embodiment, dielectric layer 1605 is plastic. The purpose of dielectric layer 1605 is to slow the travelling wave relative to free space velocity. In one embodiment, dielectric layer 1605 slows the travelling wave by 30% relative to free space. In one embodiment, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric 1605, such as periodic sub-wavelength metallic structures that can be machined or lithographically defined, for example.

An RF-array 1606 is on top of dielectric 1605. In one embodiment, the distance between interstitial conductor 1603 and RF-array 1606 is 0.1-0.15". In another embodiment, this distance may be $\lambda_{eff}/2$, where $\lambda_{eff}$ is the effective wavelength in the medium at the design frequency.

The antenna includes sides 1607 and 1608. Sides 1607 and 1608 are angled to cause a travelling wave feed from coax pin 1601 to be propagated from the area below interstitial conductor 1603 (the spacer layer) to the area above interstitial conductor 1603 (the dielectric layer) via reflection. In one embodiment, the angle of sides 1607 and 1608 are at 45° angles. In an alternative embodiment, sides 1607 and 1608 could be replaced with a continuous radius to achieve the reflection. While FIG. 10 shows angled sides that have angle of 45 degrees, other angles that accomplish signal transmission from lower level feed to upper level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers.

In operation, when a feed wave is fed in from coaxial pin 1601, the wave travels outward concentrically oriented from coaxial pin 1601 in the area between ground plane 1602 and interstitial conductor 1603. The concentrically outgoing waves are reflected by sides 1607 and 1608 and travel inwardly in the area between interstitial conductor 1603 and RF array 1606. The reflection from the edge of the circular perimeter causes the wave to remain in phase (i.e., it is an in-phase reflection). The travelling wave is slowed by dielectric layer 1605. At this point, the travelling wave starts interacting and exciting with elements in RF array 1606 to obtain the desired scattering.

To terminate the travelling wave, a termination 1609 is included in the antenna at the geometric center of the antenna. In one embodiment, termination 1609 comprises a pin termination (e.g., a 50Ω pin). In another embodiment, termination 1609 comprises an RF absorber that terminates unused energy to prevent reflections of that unused energy back through the feed structure of the antenna. These could be used at the top of RF array 1606.

FIG. 11 illustrates another embodiment of the antenna system with an outgoing wave. Referring to FIG. 11, two ground planes 1610 and 1611 are substantially parallel to each other with a dielectric layer 1612 (e.g., a plastic layer, etc.) in between ground planes. RF absorbers 1619 (e.g., resistors) couple the two ground planes 1610 and 1611 together. A coaxial pin 1615 (e.g., 50Ω) feeds the antenna. An RF array 1616 is on top of dielectric layer 1612 and ground plane 1611.

In operation, a feed wave is fed through coaxial pin 1615 and travels concentrically outward and interacts with the elements of RF array 1616.

The cylindrical feed in both the antennas of FIGS. 10 and 11 improves the service angle of the antenna. Instead of a service angle of plus or minus forty-five degrees azimuth (±45° Az) and plus or minus twenty-five degrees elevation (±25° El), in one embodiment, the antenna system has a service angle of seventy-five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Embodiments of the antenna having a cylindrical feed solve one or more problems. These include dramatically simplifying the feed structure compared to antennas fed with a corporate divider network and therefore reducing total required antenna and antenna feed volume; decreasing sensitivity to manufacturing and control errors by maintaining high beam performance with coarser controls (extending all the way to simple binary control); giving a more advantageous side lobe pattern compared to rectilinear feeds because the cylindrically oriented feed waves result in spatially diverse side lobes in the far field; and allowing polarization to be dynamic, including allowing left-hand circular, right-hand circular, and linear polarizations, while not requiring a polarizer.

Array of Wave Scattering Elements

RF array 1606 of FIG. 10 and RF array 1616 of FIG. 11 include a wave scattering subsystem that includes a group of patch antennas (i.e., scatterers) that act as radiators. This group of patch antennas comprises an array of scattering metamaterial elements.

In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor.

In one embodiment, a liquid crystal (LC) is injected in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, the liquid crystal acts as an on/off switch for the transmission of energy from the guided wave to the CELC. When switched on, the CELC emits an electromagnetic wave like an electrically small dipole antenna.

Controlling the thickness of the LC increases the beam switching speed. A fifty percent (50%) reduction in the gap between the lower and the upper conductor (the thickness of the liquid crystal) results in a fourfold increase in speed. In another embodiment, the thickness of the liquid crystal results in a beam switching speed of approximately fourteen milliseconds (14 ms). In one embodiment, the LC is doped in a manner well-known in the art to improve responsiveness so that a seven millisecond (7 ms) requirement can be met.

The CELC element is responsive to a magnetic field that is applied parallel to the plane of the CELC element and perpendicular to the CELC gap complement. When a voltage is applied to the liquid crystal in the metamaterial scattering unit cell, the magnetic field component of the guided wave induces a magnetic excitation of the CELC, which, in turn, produces an electromagnetic wave in the same frequency as the guided wave.

The phase of the electromagnetic wave generated by a single CELC can be selected by the position of the CELC on the vector of the guided wave. Each cell generates a wave in phase with the guided wave parallel to the CELC. Because the CELCs are smaller than the wave length, the output wave has the same phase as the phase of the guided wave as it passes beneath the CELC.

In one embodiment, the cylindrical feed geometry of this antenna system allows the CELC elements to be positioned at forty-five degree (45°) angles to the vector of the wave in the wave feed. This position of the elements enables control of the polarization of the free space wave generated from or received by the elements. In one embodiment, the CELCs are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the CELCs are implemented with patch antennas that include a patch co-located over a slot with liquid crystal between the two. In this respect, the metamaterial antenna acts like a slotted (scattering) wave guide. With a slotted wave guide, the phase of the output wave depends on the location of the slot in relation to the guided wave.

Cell Placement

Figure 12:
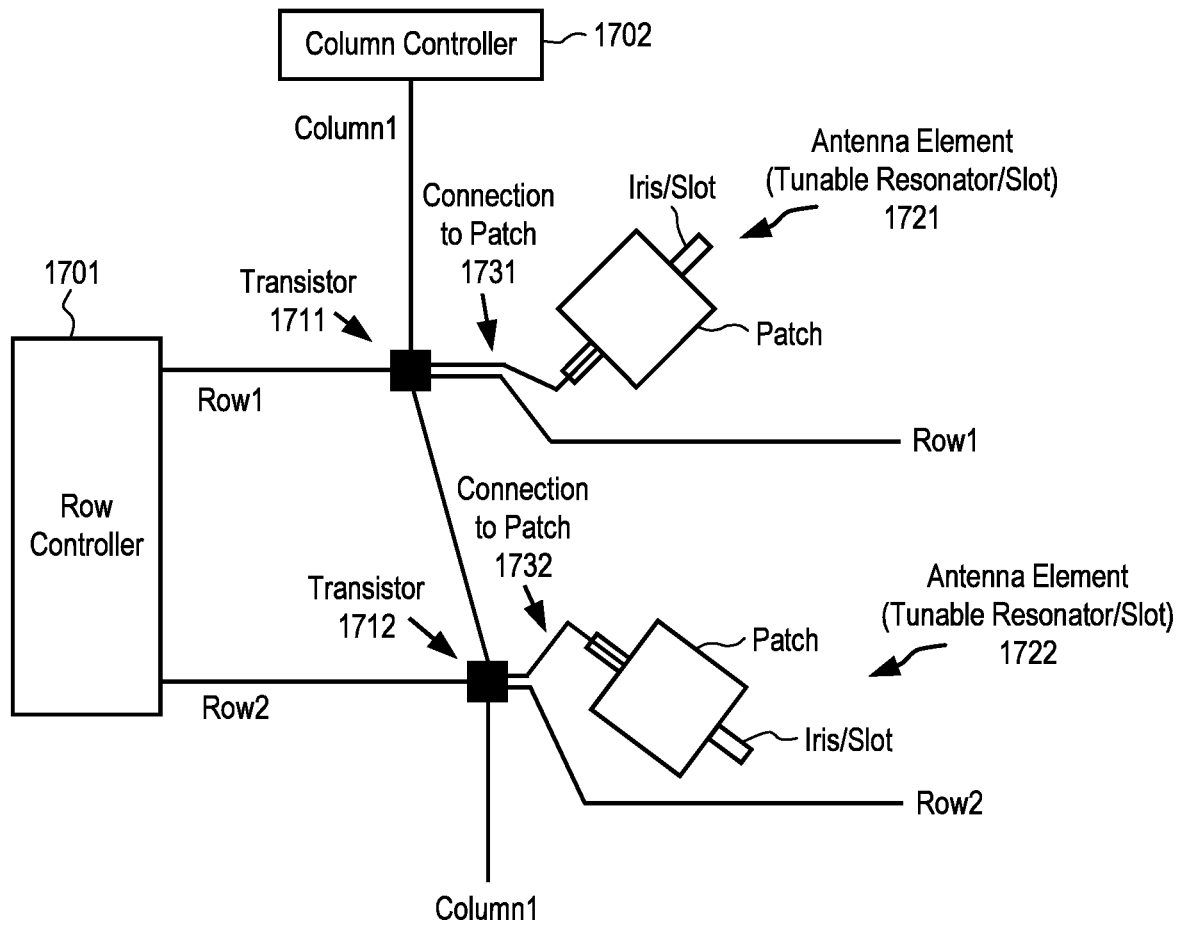
FIG. 12 illustrates one embodiment of the placement of matrix drive circuitry with respect to antenna elements.

In one embodiment, the antenna elements are placed on the cylindrical feed antenna aperture in a way that allows for a systematic matrix drive circuit. The placement of the cells includes placement of the transistors for the matrix drive. FIG. 12 illustrates one embodiment of the placement of matrix drive circuitry with respect to antenna elements. Referring to FIG. 12, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

In one embodiment, the matrix drive circuitry is predefined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 13:
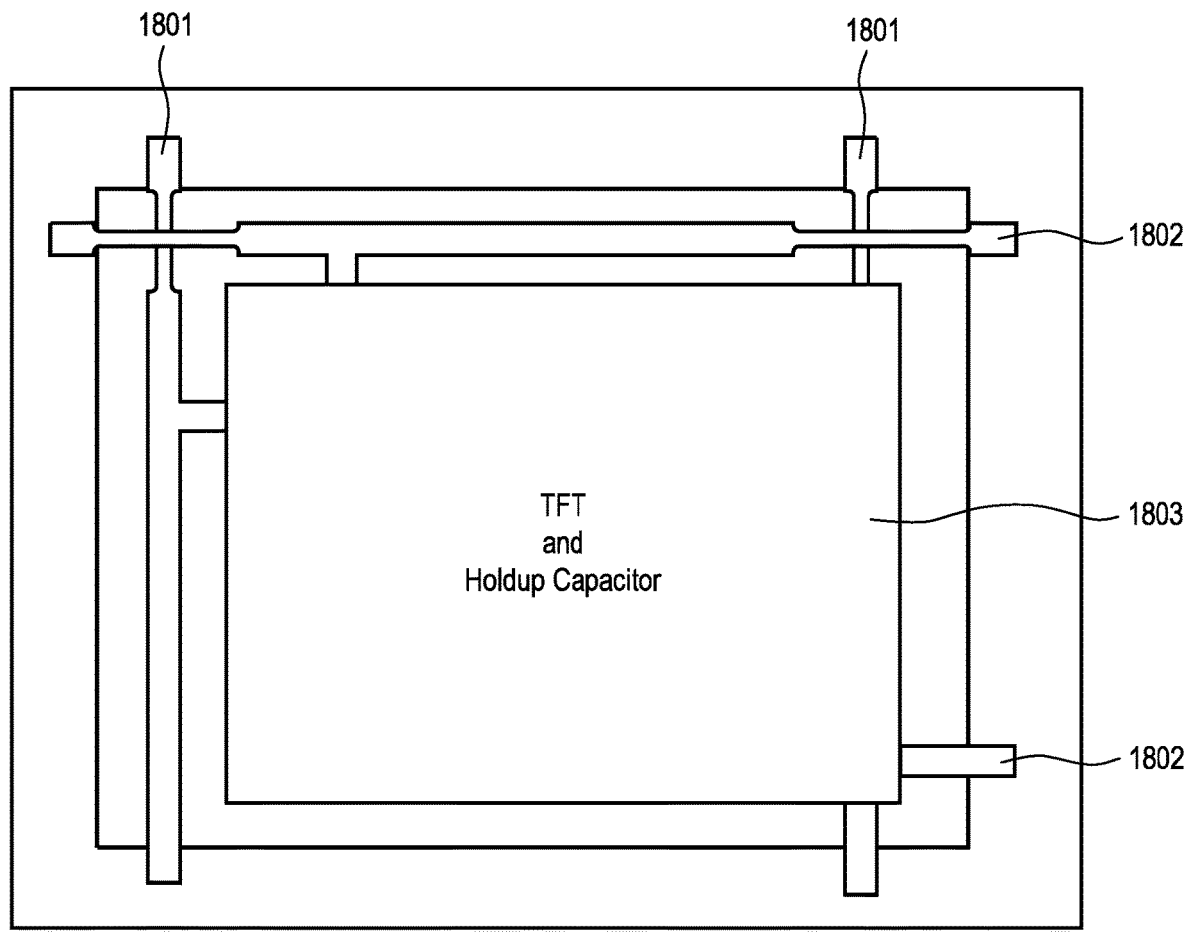
FIG. 13 illustrates one embodiment of a TFT package.

In one embodiment, a TFT package is used to enable placement and unique addressing in the matrix drive. FIG. 13 illustrates one embodiment of a TFT package. Referring to FIG. 13, a TFT and a hold capacitor 1803 is shown with input and output ports. There are two input ports connected to traces 1801 and two output ports connected to traces 1802 to connect the TFTs together using the rows and columns. In one embodiment, the row and column traces cross in 90° angles to reduce, and potentially minimize, the coupling between the row and column traces. In one embodiment, the row and column traces are on different layers.

An Example of a Full Duplex Communication System

Figure 14:
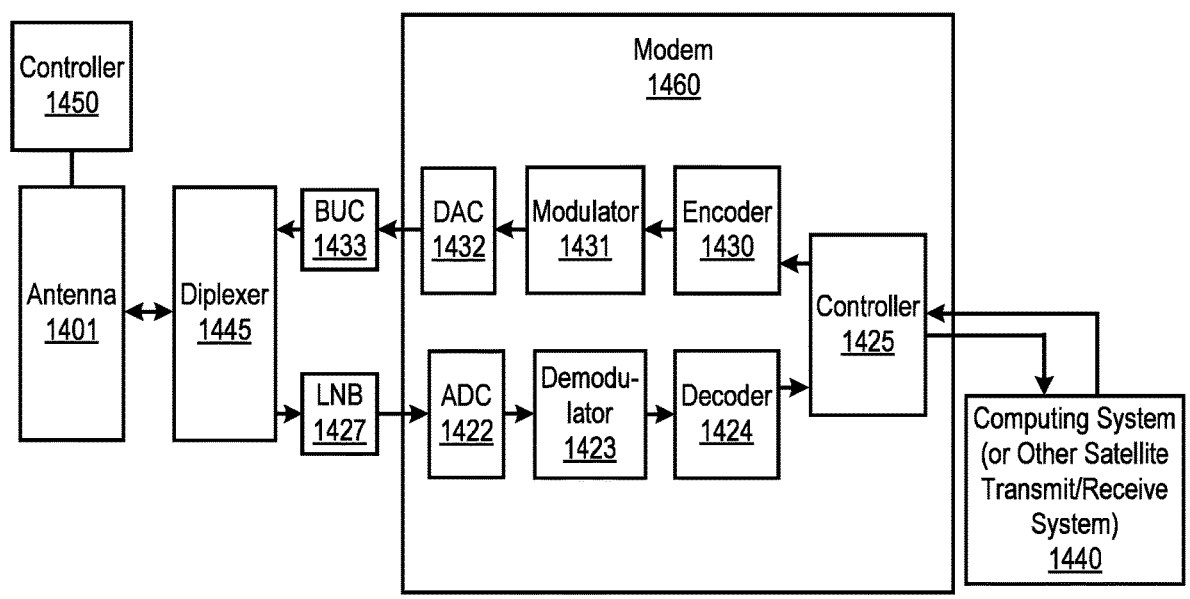
FIG. 14 is a block diagram of one embodiment of a communication system having simultaneous transmit and receive paths.

In another embodiment, the combined antenna apertures are used in a full duplex communication system. FIG. 14 is a block diagram of another embodiment of a communication system having simultaneous transmit and receive paths. While only one transmit path and one receive path are shown, the communication system may include more than one transmit path and/or more than one receive path.

Referring to FIG. 14, antenna 1401 includes two spatially interleaved antenna arrays operable independently to transmit and receive simultaneously at different frequencies as described above. In one embodiment, antenna 1401 is coupled to diplexer 1445. The coupling may be by one or more feeding networks. In one embodiment, in the case of a radial feed antenna, diplexer 1445 combines the two signals and the connection between antenna 1401 and diplexer 1445 is a single broad-band feeding network that can carry both frequencies.

Diplexer 1445 is coupled to a low noise block down converter (LNB) 1427, which performs a noise filtering function and a down conversion and amplification function in a manner well-known in the art. In one embodiment, LNB 1427 is in an out-door unit (ODU). In another embodiment, LNB 1427 is integrated into the antenna apparatus. LNB 1427 is coupled to a modem 1460, which is coupled to computing system 1440 (e.g., a computer system, modem, etc.).

Modem 1460 includes an analog-to-digital converter (ADC) 1422, which is coupled to LNB 1427, to convert the received signal output from diplexer 1445 into digital format. Once converted to digital format, the signal is demodulated by demodulator 1423 and decoded by decoder 1424 to obtain the encoded data on the received wave. The decoded data is then sent to controller 1425, which sends it to computing system 1440.

Modem 1460 also includes an encoder 1430 that encodes data to be transmitted from computing system 1440. The encoded data is modulated by modulator 1431 and then converted to analog by digital-to-analog converter (DAC) 1432. The analog signal is then filtered by a BUC (up-convert and high pass amplifier) 1433 and provided to one port of diplexer 1445. In one embodiment, BUC 1433 is in an out-door unit (ODU).

Diplexer 1445 operating in a manner well-known in the art provides the transmit signal to antenna 1401 for transmission.

Controller 1450 controls antenna 1401, including the two arrays of antenna elements on the single combined physical aperture.

The communication system would be modified to include the combiner/arbiter described above. In such a case, the combiner/arbiter after the modem but before the BUC and LNB.

Note that the full duplex communication system shown in FIG. 14 has a number of applications, including but not limited to, internet communication, vehicle communication (including software updating), etc.

There is a number of example embodiments described herein.

Example 1 is an antenna comprising: an antenna element array having a plurality of radiating radio-frequency (RF) antenna elements formed using portions of first and second substrates with a liquid crystal (LC) therebetween, the first substrate comprising a plurality of irises and the second substrate comprises a plurality of patches, wherein each of the patches is co-located over and separated from an iris in the plurality of irises with LC at least partially between each overlap region a patch and iris overlap; and a reservoir structure between the first and second substrates to hold LC and comprising areas around the RF antenna elements, the reservoir structure having a cavity large enough to accommodate thermal expansion of the LC and having one or more areas void of LC, wherein LC remains in patch/iris overlap regions of the plurality of radiating RF antenna elements even when additional LC could enter the one or more areas void of LC.

Example 2 is the antenna of example 1 that may optionally include that the one or more areas void of LC are created when initially wetting LC into the patch/iris overlap regions of the plurality of radiating RF elements.

Example 3 is the antenna of example 1 that may optionally include that antenna element structures of one or more RF antenna elements cause LC to remain within each patch/iris overlap region of each of the plurality of radiating RF elements.

Example 4 is the antenna of example 3 that may optionally include that the antenna element structures cause contact line pinning of the LC at one or more edges of each patch and iris at each patch/iris overlap region.

Example 5 is the antenna of example 4 that may optionally include that the contact line pinning is due, at least in part, to an increase in wetting angle at patch and iris metal layers.

Example 6 is the antenna of example 4 that may optionally include that contact line pinning occurs at the one or more edges of the patch and iris where a taper angle of a metal layer has a predetermined steepness to produce a wetting angle that causes formation of an energy barrier at said each patch/iris overlap region.

Example 7 is the antenna of example 6 that may optionally include that the taper angle is at least 25°.

Example 8 is the antenna of example 6 that may optionally include that each patch/iris overlap region includes an overlap of a patch metal layer and an iris metal layer, the patch metal layer having one or more additional materials layered on top of the patch metal layer except in a middle area of the patch/iris overlap region.

Example 9 is the antenna of example 1 that may optionally include that at least one of the one or more areas void of LC is within an antenna element.

Example 10 is the antenna of example 1 that may optionally include that the reservoir structure collects the LC due to LC expansion.

Example 11 is the antenna of example 10 that may optionally include that the environmental changes include a change in pressure or temperature.

Example 12 is the antenna of example 1 that may optionally include that each patch/slot pair is controlled by application of a voltage to the patch in the pair specified by a control pattern to control radiating RF antenna elements of the plurality of radiating RF antenna elements to form a beam for the frequency band for use in holographic beam steering.

Example 13 is an antenna comprising: an antenna element array having a plurality of radiating radio-frequency (RF) antenna elements formed using portions of first and second substrates with a liquid crystal (LC) therebetween, the first substrate comprising a plurality of irises and the second substrate comprises a plurality of patches, wherein each of the patches is co-located over and separated from an iris in the plurality of irises with LC at least partially between each overlap region a patch and iris overlap; and a reservoir structure between the first and second substrates to collect LC due to LC expansion and comprising areas around the RF antenna elements, the reservoir structure having a cavity large enough to accommodate thermal expansion of the LC and having one or more areas void of LC, wherein antenna element structures of one or more RF antenna element cause a portion the LC to remain within each patch/iris overlap region of each of the plurality of radiating RF elements even when additional LC could enter the one or more areas void of LC.

Example 14 is the antenna of example 13 that may optionally include that the one or more areas void of LC are created when initially wetting LC into the patch/iris overlap regions of the plurality of radiating RF elements.

Example 15 is the antenna of example 13 that may optionally include that the antenna element structures cause contact line pinning of the LC at one or more edges of each patch and iris at each patch/iris overlap region.

Example 16 is the antenna of example 15 that may optionally include that the contact line pinning is due, at least in part, to an increase in wetting angle at patch and iris metal layers.

Example 17 is the antenna of example 15 that may optionally include that contact line pinning occurs at the one or more edges of the patch and iris where a taper angle of a metal layer has a predetermined steepness to produce a wetting angle that causes formation of an energy barrier at said each patch/iris overlap region.

Example 18 is the antenna of example 17 that may optionally include that the taper angle is at least 25°.

Example 19 is the antenna of example 17 that may optionally include that each patch/iris overlap region includes an overlap of a patch metal layer and an iris metal layer, the patch metal layer having one or more additional materials layered on top of the patch metal layer except in a middle area of the patch/iris overlap region.

Example 20 is the antenna of example 13 that may optionally include that at least one of the one or more areas void of LC is within an antenna element.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An antenna comprising:
   an antenna element array having a plurality of radiating radio-frequency (RF) antenna elements formed using portions of first and second substrates with a liquid crystal (LC) therebetween, the first substrate comprising a plurality of irises and the second substrate comprises a plurality of patches, wherein each of the patches is co-located over and separated from an iris in the plurality of irises with LC at least partially between each overlap region a patch and iris overlap; and
   a reservoir structure between the first and second substrates to hold LC and comprising areas around the RF antenna elements, the reservoir structure having a cavity large enough to accommodate thermal expansion of the LC and having one or more areas void of LC, wherein LC remains in patch/iris overlap regions of the plurality of radiating RF antenna elements even when additional LC could enter the one or more areas void of LC.

2. The antenna defined in claim 1 wherein the one or more areas void of LC are created when initially wetting LC into the patch/iris overlap regions of the plurality of radiating RF elements.

3. The antenna defined in claim 1 wherein antenna element structures of one or more RF antenna elements cause LC to remain within each patch/iris overlap region of each of the plurality of radiating RF elements.

4. The antenna defined in claim 3 wherein the antenna element structures cause contact line pinning of the LC at one or more edges of each patch and iris at each patch/iris overlap region.

5. The antenna defined in claim 4 wherein the contact line pinning is due, at least in part, to an increase in wetting angle at patch and iris metal layers.

6. The antenna defined in claim 4 wherein contact line pinning occurs at the one or more edges of the patch and iris where a taper angle of a metal layer has a predetermined steepness to produce a wetting angle that causes formation of an energy barrier at said each patch/iris overlap region.

7. The antenna defined in claim 6 wherein the taper angle is at least 25°.

8. The antenna defined in claim 6 wherein each patch/iris overlap region includes an overlap of a patch metal layer and an iris metal layer, the patch metal layer having one or more additional materials layered on top of the patch metal layer except in a middle area of the patch/iris overlap region.

9. The antenna defined in claim 1 wherein at least one of the one or more areas void of LC is within an antenna element.

10. The antenna defined in claim 1 wherein the reservoir structure collects the LC due to LC expansion.

11. The antenna defined in claim 10 wherein the environmental changes include a change in pressure or temperature.

12. The antenna defined in claim 1 wherein each patch/slot pair is controlled by application of a voltage to the patch in the pair specified by a control pattern to control radiating RF antenna elements of the plurality of radiating RF antenna elements to form a beam for the frequency band for use in holographic beam steering.

13. An antenna comprising:
   an antenna element array having a plurality of radiating radio-frequency (RF) antenna elements formed using portions of first and second substrates with a liquid crystal (LC) therebetween, the first substrate comprising a plurality of irises and the second substrate comprises a plurality of patches, wherein each of the patches is co-located over and separated from an iris in the plurality of irises with LC at least partially between each overlap region a patch and iris overlap; and
   a reservoir structure between the first and second substrates to collect LC due to LC expansion and comprising areas around the RF antenna elements, the reservoir structure having a cavity large enough to accommodate thermal expansion of the LC and having one or more areas void of LC,
   wherein antenna element structures of one or more RF antenna element cause a portion the LC to remain within each patch/iris overlap region of each of the plurality of radiating RF elements even when additional LC could enter the one or more areas void of LC.

14. The antenna defined in claim 13 wherein the one or more areas void of LC are created when initially wetting LC into the patch/iris overlap regions of the plurality of radiating RF elements.

15. The antenna defined in claim 13 wherein the antenna element structures cause contact line pinning of the LC at one or more edges of each patch and iris at each patch/iris overlap region.

16. The antenna defined in claim 15 wherein the contact line pinning is due, at least in part, to an increase in wetting angle at patch and iris metal layers.

17. The antenna defined in claim 15 wherein contact line pinning occurs at the one or more edges of the patch and iris where a taper angle of a metal layer has a predetermined steepness to produce a wetting angle that causes formation of an energy barrier at said each patch/iris overlap region.

18. The antenna defined in claim 17 wherein the taper angle is at least 25°.

19. The antenna defined in claim 17 wherein each patch/iris overlap region includes an overlap of a patch metal layer and an iris metal layer, the patch metal layer having one or more additional materials layered on top of the patch metal layer except in a middle area of the patch/iris overlap region.

20. The antenna defined in claim 13 wherein at least one of the one or more areas void of LC is within an antenna element.

* * * * *